(12) United States Patent
Funatsuki et al.

(10) Patent No.: US 11,049,573 B2
(45) Date of Patent: Jun. 29, 2021

(54) SEMICONDUCTOR STORAGE DEVICE

(71) Applicant: KIOXIA CORPORATION, Tokyo (JP)

(72) Inventors: Rieko Funatsuki, Yokohama Kanagawa (JP); Takashi Maeda, Kamakura Kanagawa (JP); Hidehiro Shiga, Yokohama Kanagawa (JP); Hiroshi Maejima, Setagaya Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/802,471

(22) Filed: Feb. 26, 2020

(65) Prior Publication Data
US 2020/0395084 A1 Dec. 17, 2020

(30) Foreign Application Priority Data

Jun. 11, 2019 (JP) .............................. JP2019-108754

(51) Int. Cl.
*G11C 16/28* (2006.01)
*G11C 16/24* (2006.01)
*G11C 16/08* (2006.01)
*H01L 27/11524* (2017.01)
*H01L 27/1157* (2017.01)
*H01L 27/11529* (2017.01)
*H01L 27/11573* (2017.01)

(52) U.S. Cl.
CPC .............. *G11C 16/28* (2013.01); *G11C 16/08* (2013.01); *G11C 16/24* (2013.01); *H01L 27/1157* (2013.01); *H01L 27/11524* (2013.01); *H01L 27/11529* (2013.01); *H01L 27/11573* (2013.01)

(58) Field of Classification Search
CPC ......... G11C 16/28; G11C 16/08; G11C 16/24; H01L 27/11524; H01L 27/11529; H01L 27/11573; H01L 27/1157
See application file for complete search history.

(56) References Cited

U.S. PATENT DOCUMENTS

| 5,172,338 | A | 12/1992 | Mehrotra et al. | |
|---|---|---|---|---|
| 8,184,490 | B2 | 5/2012 | Wang et al. | |
| 9,281,071 | B2 | 3/2016 | Abe et al. | |
| 2015/0262685 | A1* | 9/2015 | Shirakawa | G11C 16/26 365/185.29 |
| 2016/0268277 | A1 | 9/2016 | Nagashima | |

(Continued)

FOREIGN PATENT DOCUMENTS

JP 2017-168163 A 9/2017

*Primary Examiner* — Tri M Hoang
(74) *Attorney, Agent, or Firm* — Kim & Stewart LLP

(57) ABSTRACT

A semiconductor storage device includes a first memory cell and a second memory cell which are connected to each other in series, a first word line which is connected to the first memory cell, a second word line which is connected to the second memory cell, and a control circuit. The control circuit is configured to charge a first node while applying a second voltage to the second word line and a first voltage to the first word line, to charge a second node on the basis of a voltage of the charged first node, to discharge the second node while applying the second voltage to the second word line and a third voltage to the first word line, and to read data from the first memory cell on the basis of voltages of the charged and discharged second node.

20 Claims, 31 Drawing Sheets

(56) References Cited

U.S. PATENT DOCUMENTS

| | | |
|---|---|---|
| 2017/0271021 A1 | 9/2017 | Futatsuyama et al. |
| 2017/0365335 A1* | 12/2017 | Wang .................. G11C 16/0483 |
| 2018/0261267 A1* | 9/2018 | Shimura ................ G11C 16/08 |
| 2019/0163398 A1* | 5/2019 | Tokiwa ................. G06F 3/0659 |
| 2019/0267092 A1* | 8/2019 | Joe ....................... G11C 11/5671 |
| 2019/0294367 A1* | 9/2019 | Takada ................... G11C 16/26 |

* cited by examiner

SEMICONDUCTOR STORAGE DEVICE

CROSS-REFERENCE TO RELATED APPLICATION(S)

This application is based upon and claims the benefit of priority from Japanese Patent Application No. 2019-108754, filed Jun. 11, 2019, the entire contents of which are incorporated herein by reference.

FIELD

Embodiments described herein relate generally to a semiconductor storage device.

BACKGROUND

A NAND-type flash memory is known as a semiconductor storage device capable of storing data in a non-volatile manner.

DETAILED DESCRIPTION

Figure 1:
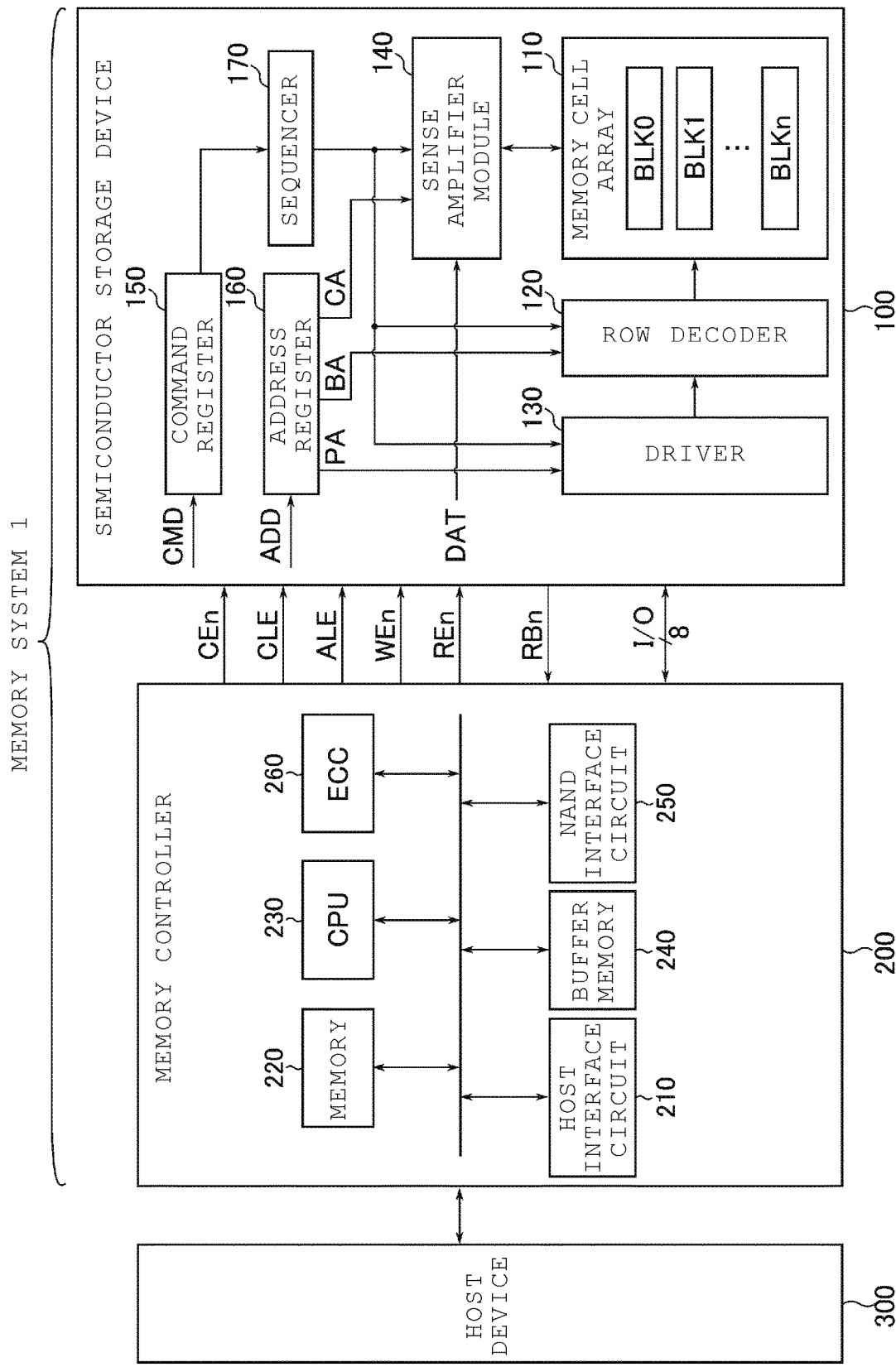
FIG. 1 is a block diagram illustrating a memory system including a semiconductor storage device according to a first embodiment.

In general, according to one embodiment, a semiconductor storage device includes a first memory cell and a second memory cell which are connected to each other in series, a first word line which is connected to the first memory cell, a second word line which is connected to the second memory cell, and a control circuit. The control circuit is configured to charge a first node while applying a second voltage to the second word line and a first voltage to the first word line, to charge a second node on the basis of a voltage of the charged first node, to discharge the second node while applying the second voltage to the second word line and a third voltage to the first word line, and to read data from the first memory cell on the basis of voltages of the charged and discharged second node.

Hereinafter, embodiments will be described with reference to the accompanying drawings. The drawings are schematic or conceptual, and dimensions, ratios, and the like in the drawings are not necessarily the same as the actual values thereof. The technical idea of the present disclosure is not limited by the shapes, structures, arrangement, and the like of components described herein.

Meanwhile, in the following description, components having substantially the same function and configuration will be denoted by the same reference sign. A numeral after the reference sign is used to distinguish between components having the same configuration. In a case where components denoted by the same reference sign are not required to be distinguished from each other, these components are respectively referred to only by the reference sign.

1. First Embodiment

A semiconductor storage device according to a first embodiment will be described. Hereinafter, a memory system including a NAND-type flash memory as a semiconductor storage device will be described as an example.

1.1 Configuration

First, a configuration of a memory system according to the present embodiment will be described.

1.1.1 Memory System

First, the overall configuration of a memory system according to the present embodiment will be described using FIG. 1.

As illustrated in FIG. 1, a memory system 1 includes a semiconductor storage device (e.g., NAND-type flash memory 100) and a memory controller 200. The NAND-type flash memory 100 and the memory controller 200 may form one semiconductor device, for example, by a combination thereof, and examples thereof include a memory card such as an SD™ card, a solid state drive (SSD), and the like. In addition, the memory controller 200 may be, for example, a system on chip (SoC) or the like.

The NAND-type flash memory 100 includes a plurality of memory cells and stores data in a non-volatile manner. The memory controller 200 is connected to the NAND-type flash memory 100 through a NAND bus and is connected to a host device 300 through a host bus. In addition, the memory controller 200 controls the NAND-type flash memory 100 and accesses the NAND-type flash memory 100 in response to a command received from the host device 300. The host device 300 is, for example, a digital camera, a personal computer, or the like, and the host bus is, for example, a bus according to an SD™ interface standard. The NAND bus transmits and receives a signal according to the NAND interface standard.

1.1.2 Configuration of Memory Controller

Subsequently, details of a configuration of the memory controller 200 will be described using FIG. 1. As illustrated in FIG. 1, the memory controller 200 includes a host interface circuit 210, a memory (RAM) 220, a processor (CPU) 230, a buffer memory 240, a NAND interface circuit 250, and an error checking and correcting (ECC) circuit 260.

The host interface circuit 210 is connected to the host device 300 through the host bus and transfers commands and data received from the host device 300 to the processor 230 and the buffer memory 240. In addition, data in the buffer memory 240 is transferred to the host device 300 in response to a command of the processor 230.

The processor 230 controls the overall operation of the memory controller 200. For example, when the processor 230 receives a write command from the host device 300, the processor 230 issues the write command to the NAND interface circuit 250 in response to the reception of the write command. This is the same as in the case of a read operation and an erasing operation. In addition, the processor 230 executes various processes, such as wear-leveling, for managing the NAND-type flash memory 100. Meanwhile, operations of the memory controller 200 to be described below may be implemented by the processor executing software (firmware) or may be implemented by hardware.

The NAND interface circuit 250 is connected to the NAND-type flash memory 100 through the NAND bus and communicates with the NAND-type flash memory 100. In addition, the NAND interface circuit 250 transmits various signals to the NAND-type flash memory 100 and receives the signals from the NAND-type flash memory 100 on the basis of commands received from the processor 230

The buffer memory 240 temporarily stores write data and read data.

The memory 220 is a semiconductor memory such as a DRAM or an SRAM and is used as a work area of the processor 230. In addition, the memory 220 stores firmware for managing the NAND-type flash memory 100, various management tables, and the like.

An ECC circuit 260 performs error detection and error correction operation related to data stored in the NAND-type flash memory 100. That is, the ECC circuit 260 generates an error correction code during data writing, imparts the generated error correction code to write data, and decodes the data at the time of data reading.

1.1.3 Configuration of NAND-Type Flash Memory

Next, a configuration of the NAND-type flash memory 100 will be described. As illustrated in FIG. 1, the NAND-type flash memory 100 includes a memory cell array 110, a row decoder 120, a driver 130, a sense amplifier module 140, a command register 150, an address register 160, and a sequencer 170.

The memory cell array 110 includes a plurality of blocks BLK including a plurality of non-volatile memory cells associated with rows and columns. In addition, the memory cell array 110 stores data supplied from the memory controller 200.

The row decoder 120 selects any one of the blocks BLK and selects a row direction in the selected block BLK.

The driver 130 supplies a voltage to the selected block BLK through the row decoder 120.

The sense amplifier module 140 senses a threshold voltage of a memory cell transistor in the memory cell array 110 during a data read operation and a verification operation and performs necessary computation in order to generate read data DAT. In addition, the read data DAT is output to the memory controller 200. Write data DAT received from the memory controller 200 is transferred to the memory cell array 110 during a data write operation.

The command register 150 stores a command CMD received from the memory controller 200. The address register 160 stores an address ADD received from the memory controller 200. The address ADD includes, for example, a block address BA, a page address PA, and a column address CA. For example, the block address BA, the page address PA, and the column address CA are respectively used to select a block BLK, a word line, and a bit line.

The sequencer 170 controls the overall operation of the NAND-type flash memory 100 on the basis of various pieces of information stored in the command register 150 and the address register 160.

1.1.4 Configuration of Memory Cell Array

Next, a configuration of the memory cell array 110 according to the present embodiment will be described.

1.1.4.1 Circuit Configuration

Figure 2:
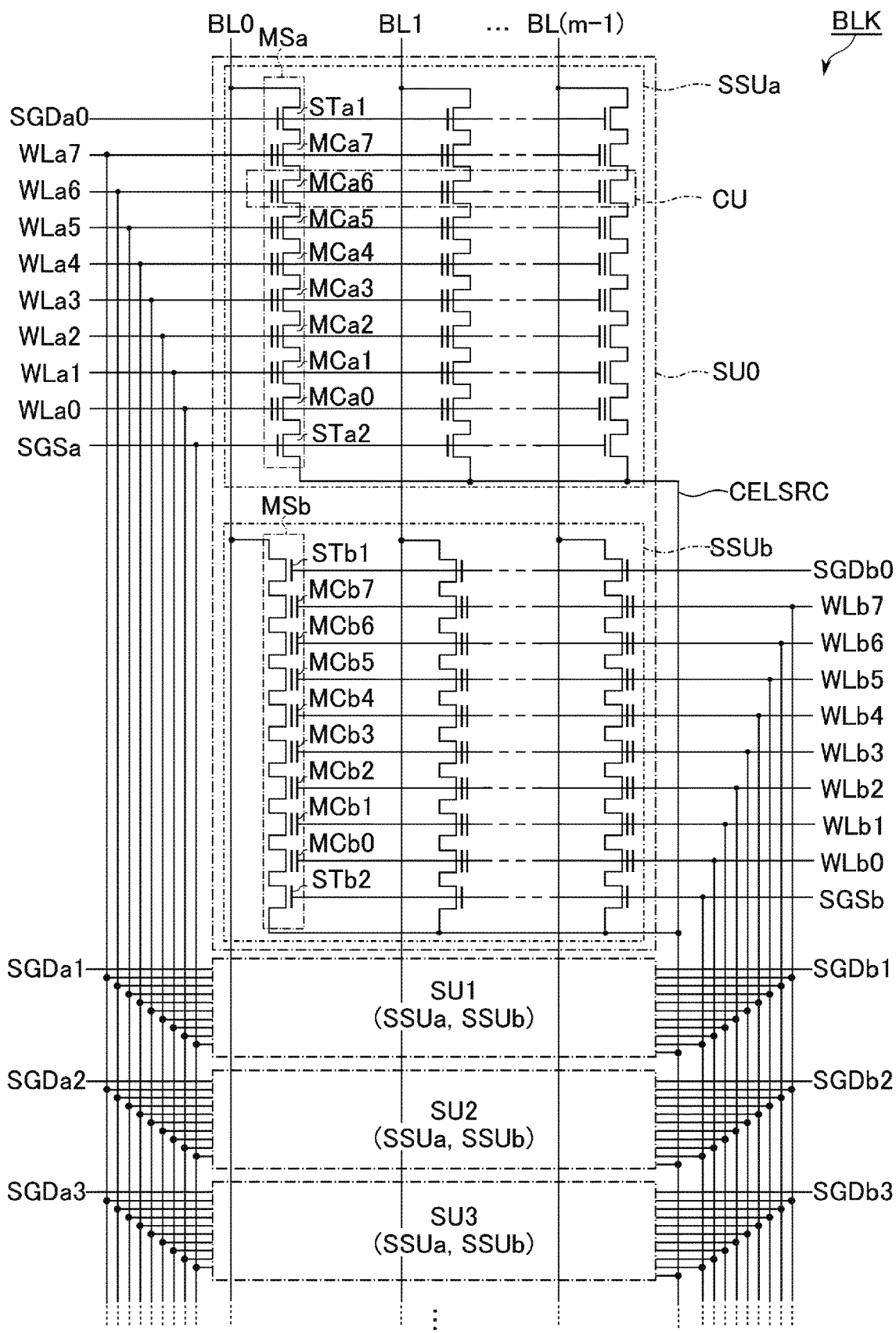
FIG. 2 is a circuit diagram illustrating a portion of a memory cell array of the semiconductor storage device according to the first embodiment.

A circuit configuration of the memory cell array 110 will be described using FIGS. 2 and 3. FIG. 2 is a circuit diagram illustrating the block BLK, and a portion of the circuit diagram illustrated in FIG. 2 will be described in FIG. 3 in detail.

First, an outline of a circuit configuration of the block BLK will be described with reference to FIG. 2. The block BLK is, for example, a unit of data management, and data stored in memory cell transistors in the same block BLK are collectively erased.

As illustrated in FIG. 2, the block BLK includes, for example, four string units SU (SU0, SU1, SU2, and SU3). In addition, each of the string units SU includes, for example, two sub-string units SSU (SSUa and SSUb). Each of the sub-string units SSU includes a plurality of memory strings MS. Hereinafter, in a case where a memory string MS of the sub-string unit SSUa and a memory string MS of the sub-string unit SSUb are distinguished from each other, the memory strings are referred to as memory strings MSa and MSb, respectively. In addition, with regard to the other configurations, wires, and the like, a distinction is made therebetween by adding "a" as a suffix to those corresponding to the sub-string unit SSUa, and by adding "b" as a suffix to those corresponding to the sub-string unit SSUb.

Each of the memory strings MS includes, for example, eight memory cell transistors MC (MC0 to MC7) and select transistors ST1 and ST2. The memory cell transistor MC stores a control gate and a charge storage layer and stores data in a non-volatile manner. In addition, the memory cell transistor MC is connected between a source of the select transistor ST1 and a drain of the select transistor ST2 in series.

Gates of select transistors STa1 in sub-string units SSUa of each of the string units SU0 to SU3 are respectively connected to select gate lines SGDa (SGDa0 to SGDa3). Gates of select transistors STb1 in sub-string units SSUb of each of the string units SU0 to SU3 are respectively connected to select gate lines SGDb (SGDb0 to SGDb3). The select gate lines SGDa0 to SGDa3 and SGDb0 to SGDb3 are independently controlled by the row decoder 120.

In addition, gates of select transistors STa2 in sub-string units SSUa in the same block BLK are connected to, for example, a select gate line SGSa in common, and gates of select transistors STb2 in sub-string units SSUb in the same block BLK are connected to, for example, a select gate line SGSb in common. For example, the select gate lines SGSa and SGSb may be connected in common or may be independently controllable.

In addition, control gates of memory cell transistors MCa (MCa0 to MCa7) in sub-string units SSUa in the same block BLK are respectively connected to word lines WLa (WLa0 to WLa7) in common. On other hand, control gates of memory cell transistors MCb (MCb0 to MCb7) in sub-string units SSUb are respectively connected to word lines WLb (WLb0 to WLb7) in common. The word lines WLa and WLb are independently controlled by the row decoder 120.

Further, drains of select transistors ST1 of the memory strings MS in the same column in the memory cell array 110 are connected to bit lines BL (BL1 to BLm, wherein m is a natural number of more than or equal to 2). That is, the bit line BL connects a set of memory strings MSa and MSb across the plurality of string units SU in common. Further, sources of the plurality of select transistors ST2 are connected to a source line CELSRC in common.

That is, the sub-string unit SSU is a group of memory strings MS connected to different bit lines BL and to the same select gate line SGD. A group of memory cell transistors MC connected to the same word line WL in common among the sub-string units SSU is also referred to as a cell unit CU. In addition, the block BLK is a group of sub-string units SSU that share the plurality of word lines WL. Further, the memory cell array 110 is a group of blocks BLK that share the plurality of bit lines BL.

Next, a circuit configuration of memory strings MSa and MSb connected to the same bit line BL in parallel in any string unit SU will be described in detail with reference to FIG. 3. In the following description related to FIG. 3, it is assumed that memory strings MSa and MSb are connected to the same bit line BL in parallel in any string unit SU.

As described above, current paths both ends of the memory strings MSa and MSb are electrically connected. In addition, as illustrated in FIG. 3, current paths inside the memory strings MSa and MSb are electrically connected. Specifically, a current path between the select transistor STa1 and the memory cell transistor MCa7 is electrically connected to a current path between the select transistor STb1 and the memory cell transistor MCb7. A current path between a memory cell transistor MCak and a memory cell transistor MCa (k+1) which are adjacent to each other is electrically connected to a current path between a memory cell transistor MCbk and a memory cell transistor MCb (k+1) ($0 \leq k \leq 7$). A current path between the memory cell transistor MCa0 and the select transistor STa2 is electrically connected to a current path between the memory cell transistor MCb0 and the select transistor STb2.

1.1.4.2 Cross-Sectional Structure

Next, a cross-sectional structure of the memory cell array 110 will be described. Meanwhile, in the following description, it is assumed that a plane along a semiconductor substrate is referred to as an XY plane, wherein an X-axis and a Y-axis intersect each other. The bit line BL extends along the X-axis direction. In addition, an axis perpendicular to the XY plane is referred to as a Z-axis, and a direction in which various materials are stacked on the semiconductor substrate is referred to as an upper direction or a stacking direction. For example, the X-axis and the Y-axis are orthogonal to each other, and an XYZ coordinate system corresponds to a right-hand coordinate system.

The memory cell array 110 is formed inside a stacked body in which wires corresponding to the select gate lines SGS, the word lines WL, and the select gate lines SGD are sequentially stacked on the semiconductor substrate. For example, a memory pillar extending along the Z-axis direction is formed as a structure corresponding to a set of the memory strings MSa and MSb described with reference to FIG. 3 in the stacked body.

Figure 3:
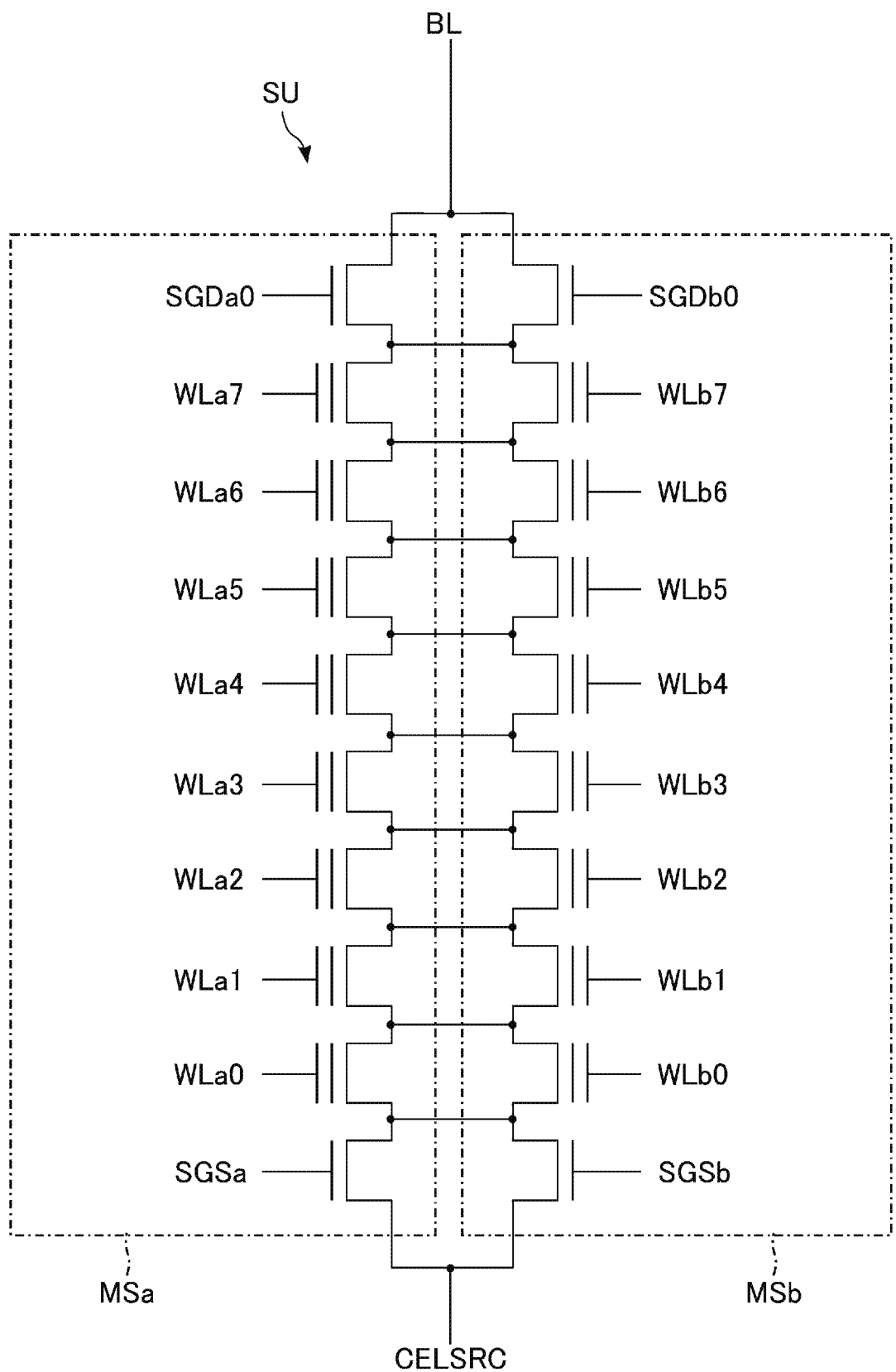
FIG. 3 is a circuit diagram illustrating a portion of the memory cell array of the semiconductor storage device according to the first embodiment.
Figure 4:
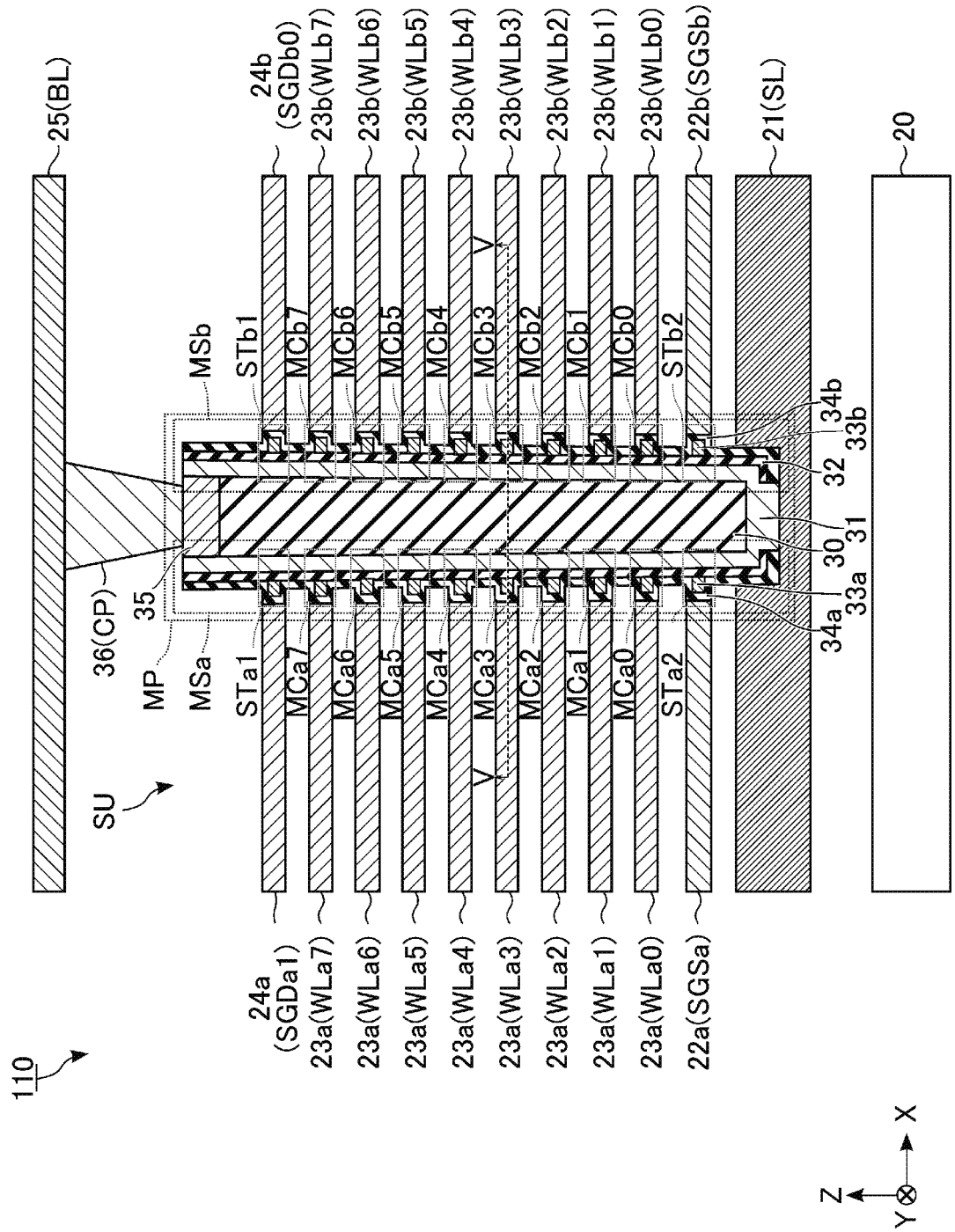
FIG. 4 is a cross-sectional view illustrating a memory pillar as a portion of the memory cell array corresponding to FIG. 3.
Figure 5:
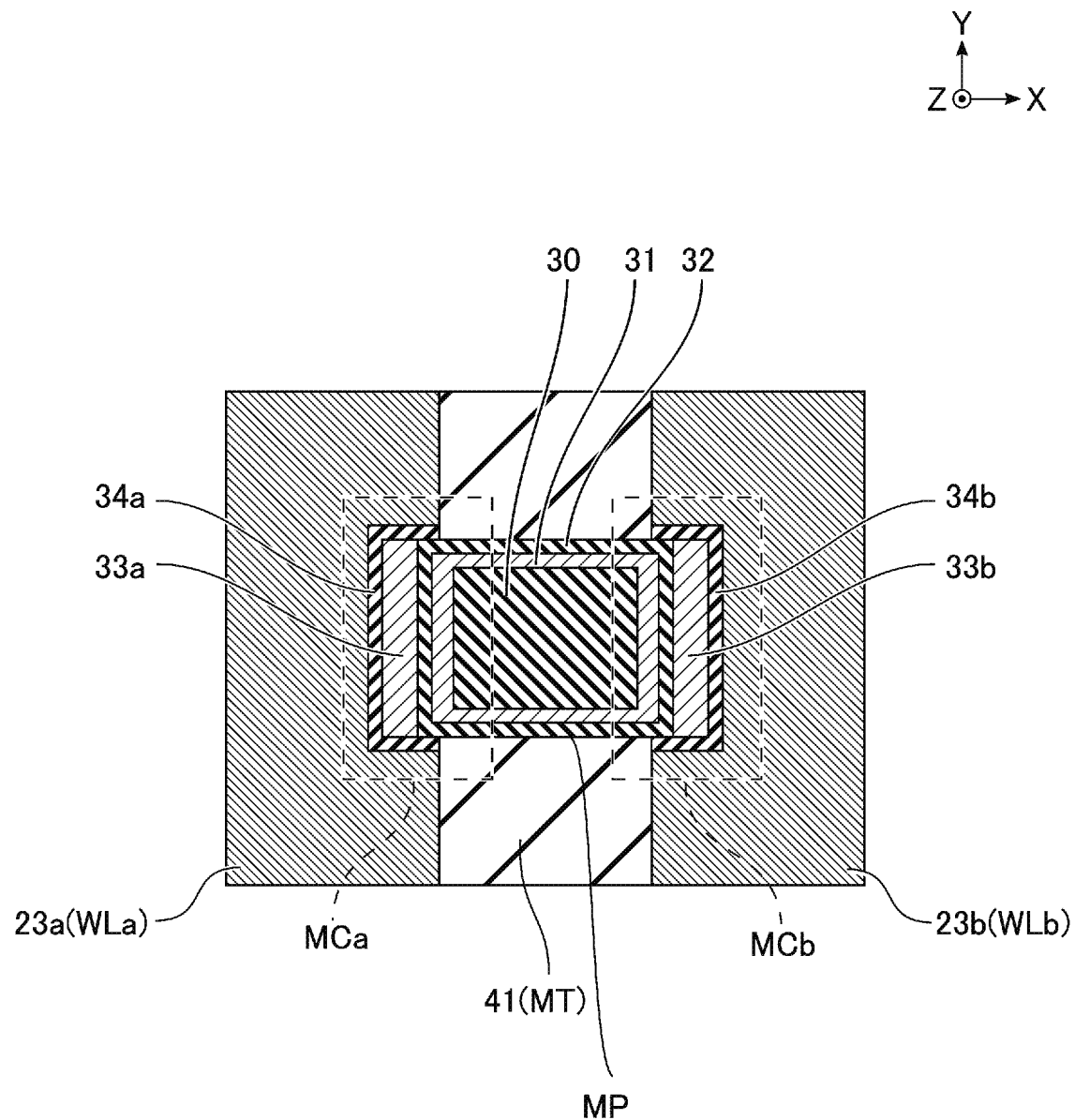
FIG. 5 is a cross-sectional view of the memory pillar taken along a line V-V in FIG. 4.

FIG. 4 is a cross-sectional view illustrating a memory pillar as a structure corresponding to a set of the memory strings MSa and MSb illustrated in FIG. 3. FIG. 5 is a cross-sectional view taken along a line V-V in FIG. 4. Meanwhile, in FIG. 4, for convenience of description, a stacked insulating film is omitted.

First, a configuration of a cross-section along an XY plane of a memory pillar MP will be described with reference to FIG. 4. FIG. 4 illustrates a configuration including a memory pillar MP in any string unit SU and a plurality of conductor layers functioning as various wires connected to the memory pillar MP.

As illustrated in FIG. 4, a conductor layer 21 functioning as the source line CELSRC is provided on a semiconductor substrate 20. The conductor layer 21 is formed of a conductive material, and for example, an n-type semiconductor with impurities added thereto or a metal material is used. In addition, for example, the conductor layer 21 may have a structure on which a semiconductor layer and a metal layer are stacked. Meanwhile, circuits such as the row decoder 120 and the sense amplifier module 140 may be provided between the semiconductor substrate 20 and the conductor layer 21.

A conductor layer 22 functioning as the select gate line SGS, eight conductor layers 23 functioning as the word lines WL0 to WL7, and a conductor layer 24 functioning as the select gate line SGD are sequentially stacked on the conductor layer 21 through a plurality of insulator layers not shown in the drawing so that the layers are separated from each other along the Z-axis direction.

The conductor layers 22 to 24 are formed of a conductive material, and for example, an n-type semiconductor with impurities added thereto, a p-type semiconductor, or a metal material is used. For example, a stacked structure of titanium nitride (TiN)/tungsten (W) is used as the conductor layers 22 to 24. Titanium nitride (TiN) functions as a barrier layer for preventing tungsten (W) and silicon oxide ($SiO_2$) from reacting with each other or a layer for improving adhesiveness of tungsten (W), for example, when tungsten (W) is deposited by chemical vapor deposition (CVD).

A conductor layer 25 is provided on the conductor layer 24 through an insulator layer (not shown). A plurality of conductor layers 25 arranged along the Y-axis direction extend linearly in the X-axis direction, and each of the conductor layers is used as a bit line BL. The conductor layer 25 contains, for example, copper (Cu).

The memory pillar MP extends along the Z-axis direction and penetrates the conductor layers 22 to 24, so that the bottom surface thereof reaches the conductor layer 21. The conductor layers 22 to 24 are divided into conductor layers 22a and 22b, conductor layers 23a and 23b, and conductor layers 24a and 24b by the memory pillar MP and an insulator layer (not shown) extending from the memory pillar MP along the Y-axis direction. That is, in the same layer, the conductor layers 22a and 22b, the conductor layers 23a and 23b, or the conductor layers 24a and 24b are electrically disconnected from each other by the insulator layer not shown in the drawing and the memory pillar MP. The insulator layer not shown in the drawing is also referred to as a memory trench.

In addition, the memory pillar MP includes a core layer 30, a semiconductor layer 31, a tunnel insulating film 32, charge storage layers 33a and 33b, block insulating films 34a and 34b, and a cap layer 35.

The core layer 30 extends along the Z-axis direction. An upper end of the core layer 30 is provided in a layer above the conductor layer 24, and a lower end of the core layer 30 is provided in, for example, a layer provided with the conductor layer 21. The core layer 30 contains, for example, silicon oxide ($SiO_2$).

The semiconductor layer 31 covers the bottom surface and the side surface of the core layer 30. An upper end of the semiconductor layer 31 is provided in an upper layer above the upper end of the core layer 30, and a lower end of the semiconductor layer 31 is in contact with the conductor layer 21. The semiconductor layer 31 contains, for example, polysilicon.

The tunnel insulating film 32 covers the side surface and the bottom surface of the semiconductor layer 31 except for a portion where the conductor layer 21 and the semiconductor layer 31 are in contact with each other. The tunnel insulating film 32 contains, for example, silicon oxide ($SiO_2$).

In each of layers provided with the conductor layers 22a to 24a, the charge storage layer 33a is provided between the tunnel insulating film 32 and the block insulating film 34a. The block insulating film 34a is provided as a continuous film along the Z-axis direction between each of the charge storage layers 33a and the conductor layers 22a to 24a. The block insulating film 34a covers all of the charge storage layers 33a in the same memory pillar MP except for, for example, a portion where the tunnel insulating film 32 and each of the charge storage layers 33a are in contact with each other.

In each of layers provided with the conductor layers 22b to 24b, the charge storage layer 33b is provided between the tunnel insulating film 32 and the block insulating film 34b. The block insulating film 34b is provided between each of the charge storage layers 33b and the conductor layers 22b to 24b as a continuous film along the Z-axis direction. The block insulating film 34b covers all of the charge storage layers 33b in the same memory pillar MP except for, for example, a portion where the tunnel insulating film 32 and each of the charge storage layers 33b are in contact with each other.

The charge storage layers 33a and 33b contain, for example, polysilicon or a metal material. The block insulating films 34a and 34b contain, for example, silicon oxide ($SiO_2$). A high dielectric constant (High-k) material may be further provided between the charge storage layer 33a and the block insulating film 34a and between the charge storage layer 33b and the block insulating film 34b. The high dielectric constant material contains, for example, hafnium silicate (HfSiO) and has a function of improving characteristics of the block insulating films 34a and 34b.

The cap layer 35 covers the upper surface of the core layer 30 and is in contact with an inner wall portion of the semiconductor layer 31. The cap layer 35 contains, for example, polysilicon.

A conductor layer 36 functioning as a columnar contact CP is provided on the upper surface of the cap layer 35 of the memory pillar MP. The upper surface of each of the conductor layers 36 is in contact with one corresponding conductor layer 25 so as to be electrically connected thereto.

Next, a configuration of a cross-section along the XY plane of the memory pillar MP will be described with reference to FIG. 5. FIG. 5 illustrates the word lines WLa and WLb and the memory pillar MP and the memory trench MT which are formed between the word lines WLa and WLb.

As illustrated in FIG. 5, the memory pillar MP is provided in an insulator layer 41 functioning as the memory trench MT and two conductor layers 23a and 23b are on either side of the insulator layer 41 in the X-axis direction. Specifically, for example, the memory pillar MP has a substantially rectangular shape which is in contact with each of the conductor layers 23a and 23b while dividing the insulator layer 41 in the XY plane.

The core layer 30 is provided in the central portion of the memory pillar MP, and the semiconductor layer 31 surrounds the side surface of the core layer 30. The tunnel insulating film 32 surrounds the side surface of the semiconductor layer 31. Two side surfaces among the side surfaces of the tunnel insulating film 32 that extend in the X-axis direction are in contact with the insulator layer 41.

The charge storage layer 33a is provided on the side surface of the tunnel insulating film 32 that is on the conductor layer 23a side. The block insulating film 34a is provided between the charge storage layer 33a and the conductor layer 23a.

The charge storage layer 33b is provided on the side surface of the tunnel insulating film 32 that is on the conductor layer 23b side. The block insulating film 34b is provided between the charge storage layer 33b and the conductor layer 23b.

In the above-described structure of the memory pillar MP, a portion where the memory pillar MP and the conductor layer 22a intersect each other functions as the select transistor STa2, and a portion where the memory pillar MP and the conductor layer 22b intersect each other functions as the select transistor STb2. A portion where the memory pillar MP and the conductor layer 23a intersect each other functions as the memory cell transistor MCa, and a portion where the memory pillar MP and the conductor layer 23b intersect each other functions as the memory cell transistor MCb. A portion where the memory pillar MP and the conductor layer 24a intersect each other functions as the select transistor STa1, and a portion where the memory pillar MP and the conductor layer 24b intersect each other functions as the select transistor STb1.

That is, the semiconductor layer 31 is used as a channel and a well region of each of the select transistors STa1 and STb1, the memory cell transistors MCa and MCb, and the select transistors STa2 and STb2. The charge storage layer 33a is used as a floating gate of the memory cell transistor MCa and the select transistors STa1 and STa2, and the charge storage layer 33b is used as a floating gate of the memory cell transistor MCb and the select transistors STb1 and STb2. Thereby, each of the memory pillars MP functions as, for example, a set of two memory strings MSa and MSb.

Meanwhile, the above-described structure of the memory cell array 110 is just an example, and the memory cell array 110 may have any of other structures. For example, the number of conductor layers 23 is based on the number of word lines WL, which can be designed to any number. Any number of conductor layers 22 and 24 may be allocated to each of the select gate lines SGS and SGD. In a case where a plurality of conductor layers 22 are allocated to the select gate line SGS, a conductor may be used for each of the plurality of conductor layers 22. Any number of conductor layers functioning as a dummy word line (not shown) may be provided between the word line WL located at the lowermost layer and the select gate line SGS and between the word line WL located at the uppermost layer and the select gate line SGD. The memory pillar MP and the conductor layer 25 may be electrically connected to each other through two or more contacts, or may be electrically connected to each other through other wires. The inside of the memory trench MT may include insulators of a plurality of types.

1.1.5 Threshold Voltage Distribution of Memory Cell Transistor

Next, a threshold voltage distribution of the memory cell transistors MC in the memory cell array 110 will be described.

In the present embodiment, one memory cell transistor MC can store, for example, data of two bits, which are respectively referred to as a lower bit and an upper bit. In addition, a set of lower bits stored in memory cells belonging to the same cell unit CU is referred to as a lower page, and a set of upper bits is referred to as an upper page. That is, two pages are allocated to one word line WL (one cell unit CU) in one sub-string unit SSU, and the sub-string unit SSU including eight word lines WL has a capacity corresponding to 16 pages. In other words, the "page" may also be defined as a portion of a memory space formed in the cell unit CU. Writing and reading of data may be performed for each page or for each cell unit CU. On the other hand, as described above, data erasure is performed in units of blocks BLK.

Figure 6:
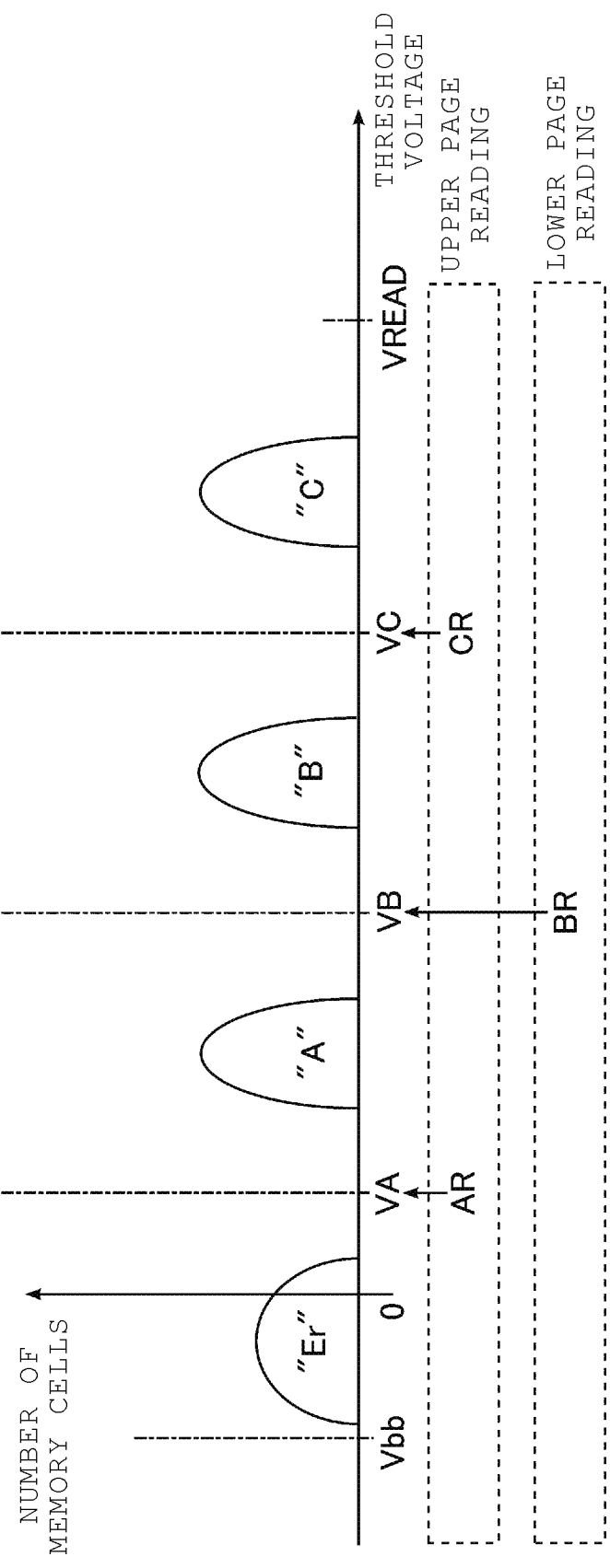
FIG. 6 is a conceptual diagram illustrating data and a threshold voltage distribution of memory cell transistors of the semiconductor storage device according to the first embodiment.

FIG. 6 is a diagram illustrating a threshold voltage distribution of the memory cell transistors MC in the memory cell array 110 after a write operation.

As described above, the memory cell transistor MC can store data of 2 bits. That is, the memory cell transistor MC can take four states in accordance with a threshold voltage by a write operation. The four states are referred to as an "Er" state, an "A" state, a "B" state, and a "C" state in ascending order of threshold voltage.

A threshold voltage of a memory cell transistor MC in an "Er" state is equal to or greater than a voltage Vbb and less than a voltage VA (>Vbb), and is equivalent to a data erased state. The voltage Vbb is, for example, a negative voltage (<0 V) and is the lowest voltage capable of being generated in the NAND-type flash memory 100. The voltage VA is a voltage of, for example, equal to or greater than 0 V.

A threshold voltage of a memory cell transistor MC in an "A" state is equal to or greater than the voltage VA and less than a voltage VB (>VA). A threshold voltage of a memory cell transistor MC in a "B" state is equal to or greater than the voltage VB and less than a voltage VC (>VB). A threshold voltage of a memory cell transistor MC in a "C" state is equal to or greater than the voltage VC and less than a voltage VREAD (>VC). In this manner, the "C" state among the four states is a state having the highest threshold voltage. The voltages VA to VC are collectively referred to as a "read voltage Vcgrv" or simply as a "read voltage".

The voltage VREAD is, for example, a voltage for turning on the memory cell transistors MC regardless of stored data, is applied to a word line WL that is not to be read during a read operation, and is higher than any read voltage Vcgrv.

The threshold voltage distribution is provided by writing data of 2 bits including the above-described lower bit and upper bit. That is, a relationship between the "Er" to "C" states and lower and upper bit is as follows.

"Er" state: "11" (shown in the order of "upper/lower")
"A" state: "01"
"B" state: "00"
"C" state: "10"

In this manner, only one bit out of two bits changes between two adjacent states in the threshold voltage distribution.

When a lower bit is read, a voltage equivalent to a boundary where the value ("0" or "1") of the lower bit changes may be used, which is the same of an upper bit.

That is, the lower page reading includes an operation BR of using the voltage VB for distinguishing between the "A" state and the "B" state as a read voltage. The upper page reading includes an operation AR of using the voltage VA for distinguishing between the "Er" state and the "A" state as a read voltage and an operation CR of using the voltage VC for distinguishing between the "B" state and the "C" state as a read voltage.

1.1.5 Configuration of Sense Amplifier Module

Next, a configuration of the sense amplifier module of the semiconductor storage device according to the first embodiment will be described.

Figure 7:
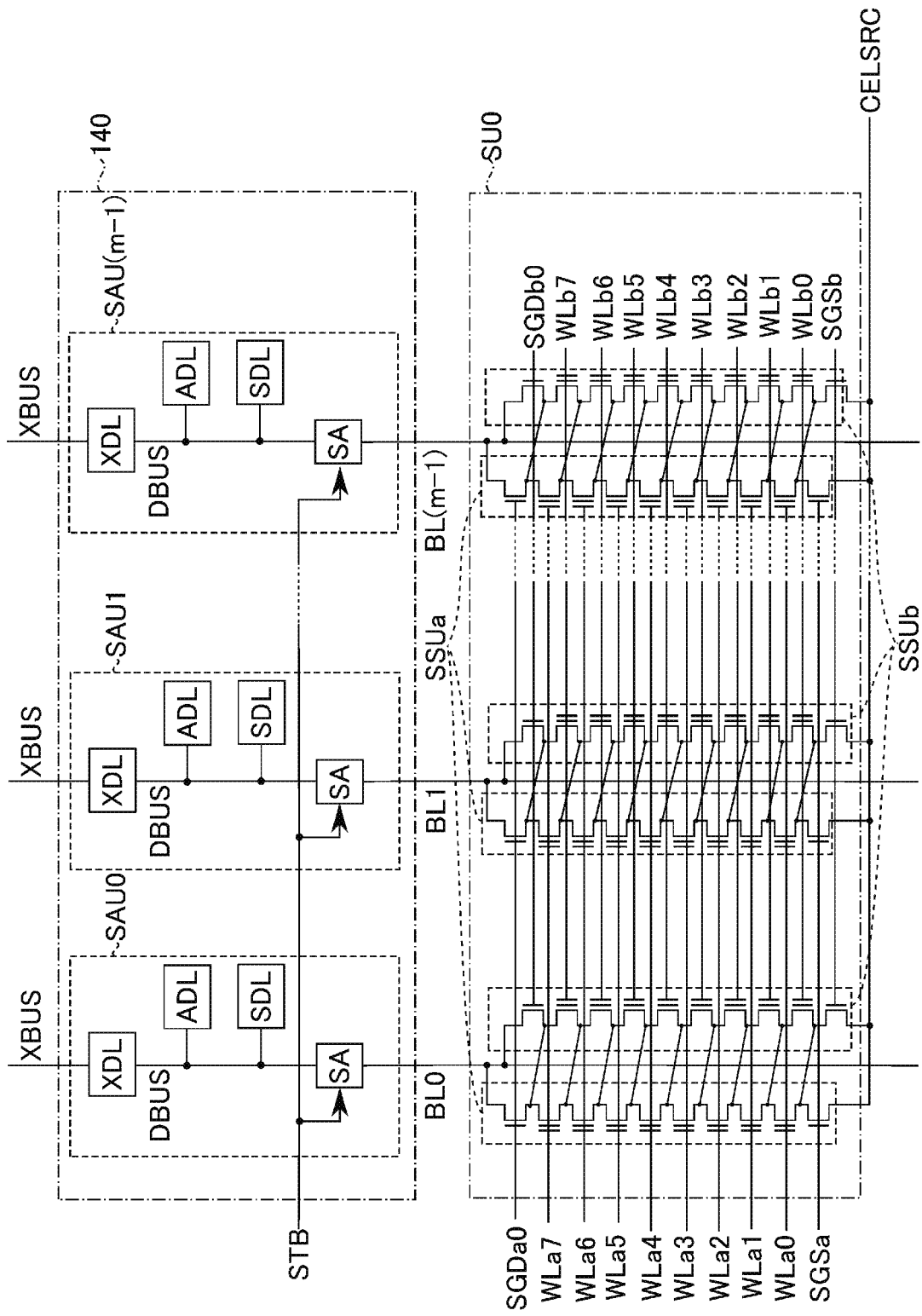
FIG. 7 is a circuit diagram illustrating a connection relationship between the memory cell array and a sense amplifier of the semiconductor storage device according to the first embodiment.

FIG. 7 is a block diagram illustrating an example of a configuration of the sense amplifier module of the semiconductor storage device according to the first embodiment. As illustrated in FIG. 7, the sense amplifier module 140 includes sense amplifier units SAU (SAU0, SAU1, ..., and SAU (m−1)) which are provided for each bit line BL.

Each of the sense amplifier units SAU includes a sense amplifier SA and latch circuits SDL, ADL, and XDL.

The sense amplifier SA reads data by sensing a threshold voltage of a memory cell transistor MC using a voltage or a current of a corresponding bit line BL and applies a voltage to the bit line BL in accordance with write data. That is, the sense amplifier SA directly controls the bit line BL. In addition, a signal STB is applied to the sense amplifier SA by, for example, the sequencer 170 during a read operation. The sense amplifier SA determines read data at a timing when the signal STB is asserted and stores the read data in the latch circuit SDL.

The latch circuit SDL temporarily stores read data read by the sense amplifier SA and write data written by the sense amplifier SA. As will be described later, in the sense amplifier unit SAU, the sense amplifier SA includes anode SEN, and the latch circuits SDL, ADL, and XDL are connected to each other by a bus DBUS.

Input and output of data in the sense amplifier module 140 are performed through the latch circuit XDL. That is, data received from the memory controller 200 is transferred to the latch circuit XDL through a bus XBUS for input and output and is then transmitted to the latch circuits SDL and ADL or the sense amplifier SA through the bus DBUS. In addition, data of the latch circuits SDL and ADL or the sense amplifier SA is transferred to the latch circuit XDL through the bus DBUS and is then transmitted to the memory controller 200 through the bus XBUS.

Figure 8:
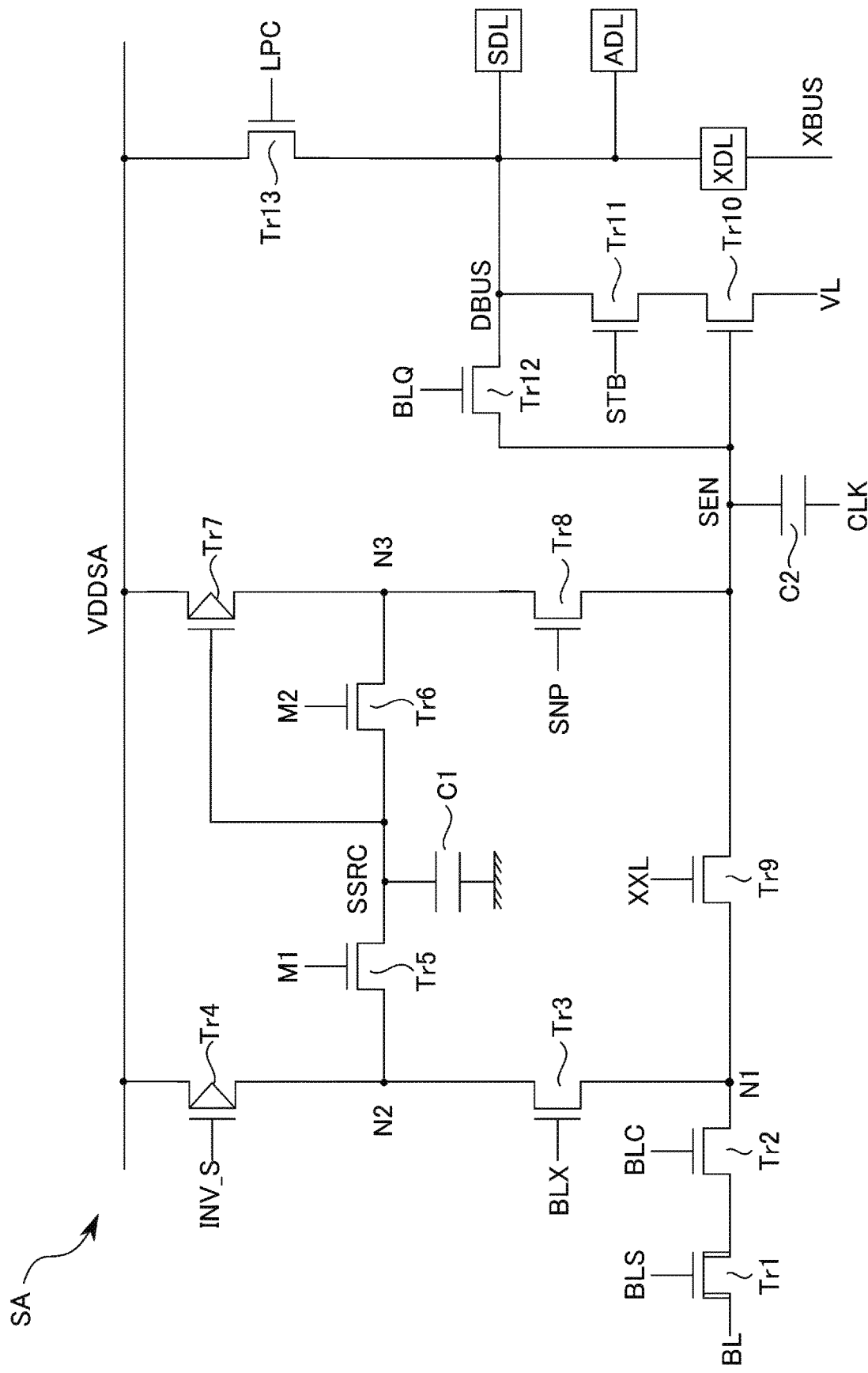
FIG. 8 is a circuit diagram illustrating the sense amplifier of the semiconductor storage device according to the first embodiment.

FIG. 8 is a circuit diagram illustrating an example of a configuration of the sense amplifier unit of the semiconductor storage device according to the first embodiment. In FIG. 8, a circuit configuration of the sense amplifier SA among the sense amplifier units SAU in the sense amplifier module 140, and a connection relationship between the sense amplifier SA and various latch circuits SDL, ADL, and XDL are illustrated as an example.

As illustrated in FIG. 8, the sense amplifier SA includes transistors Tr1, Tr2, Tr3, Tr4, Tr5, Tr6, Tr7, Tr8, Tr9, Tr10, Tr11, Tr12, and Tr13, and capacitors C1 and C2. For example, the transistors Tr1 to Tr3, Tr5, Tr6, and Tr8 to Tr13 have an n-type polarity, and the transistors Tr4 and Tr7 have a p-type polarity.

The transistors Tr1 to Tr13 may have different threshold voltages. In the following description, a signal for setting the transistors Tr1 to Tr3, Tr5, Tr6, and Tr8 to Tr13 having an n-type polarity to be in an on state may be referred to as a "high (H)" level irrespective of the magnitude thereof, and a signal for setting these transistors to be in an off state may be referred to as a "low (L)" level irrespective of the magnitude thereof. In addition, a signal for setting the transistors Tr4 and Tr7 having a p-type polarity to be in an on state may be referred to as an "L" level irrespective of the magnitude thereof, and a signal for setting these transistors to be in an off state may be referred to as an "H" level irrespective of the magnitude thereof.

The transistor Tr1 includes a first end connected to a bit line BL, a second end connected to a first end of the transistor Tr2, and a gate to which a signal BLS is supplied. The transistor Tr1 is formed to have a higher breakdown voltage than the other transistors Tr2 to Tr13 in the sense amplifier SA.

The transistor Tr2 includes a second end connected to the node N1 and a gate to which the signal BLC is supplied.

The transistor Tr3 includes a first end connected to the node N1, a second end connected to a node N2, and a gate to which a signal BLX is supplied.

The transistor Tr4 includes a first end connected to the node N2, a second end to which a voltage VDDSA is supplied, and a gate to which a signal INV_S is supplied. The voltage VDDSA is a voltage which is supplied from the outside of the sense amplifier SA for driving the sense amplifier SA.

The transistor Try includes a first end connected to the node N2, a second end connected to a node SSRC, and a gate to which a signal M1 is supplied.

The transistor Tr6 includes a first end connected to the node SSRC, a second end connected to a node N3, and a gate to which a signal M2 is supplied.

The transistor Tr7 includes a first end connected to the node N3, a second end to which a voltage VDDSA is supplied, and a gate connected to the node SSRC.

The capacitor C1 includes a first end connected to the node SSRC and a grounded second end.

The transistor Tr8 includes a first end connected to the node N3, a second end connected to the node SEN, and a gate to which a signal SNP is supplied.

The transistor Tr9 includes a first end connected to the node N1, a second end connected to the node SEN, and a gate to which a signal XXL is supplied.

The transistor Tr10 includes a first end connected to a node VL, a second end connected to a first end of the transistor Tr11, and a gate connected to the node SEN. For example, a voltage lower than the voltage VDDSA is supplied to the node VL.

The transistor Tr11 includes a second end connected to the bus DBUS and a gate to which a signal STB is supplied.

The transistor Tr12 includes a first end connected to the node SEN, a second end connected to the bus DBUS, and a gate to which a signal BLQ is supplied.

The capacitor C2 includes a first end connected to the node SEN and a second end to which a signal CLK is supplied.

The transistor Tr13 includes a first end connected to the bus DBUS, a second end to which the voltage VDDSA is supplied, and a gate to which a signal LPC is supplied.

With the above-described configuration, the sense amplifier SA can execute a read operation capable of preventing erroneous reading of data by applying a reference current and a read current to the same memory pillar MP as will be described later.

1.2 Operation

Subsequently, a read operation in the semiconductor storage device according to the present embodiment will be described.

In the following description, with regard to the memory cell transistors MC, the memory string MS including the memory cell transistors MC, and the word lines WL connected to the memory cell transistors MC, a distinction is made as necessary by adding "selected" in a case where the memory cell transistor MC is an object to be read and adding "non-selected" in a case where the memory cell transistor MC is not an object to be read.

1.2.1 Flowchart

Figure 9:
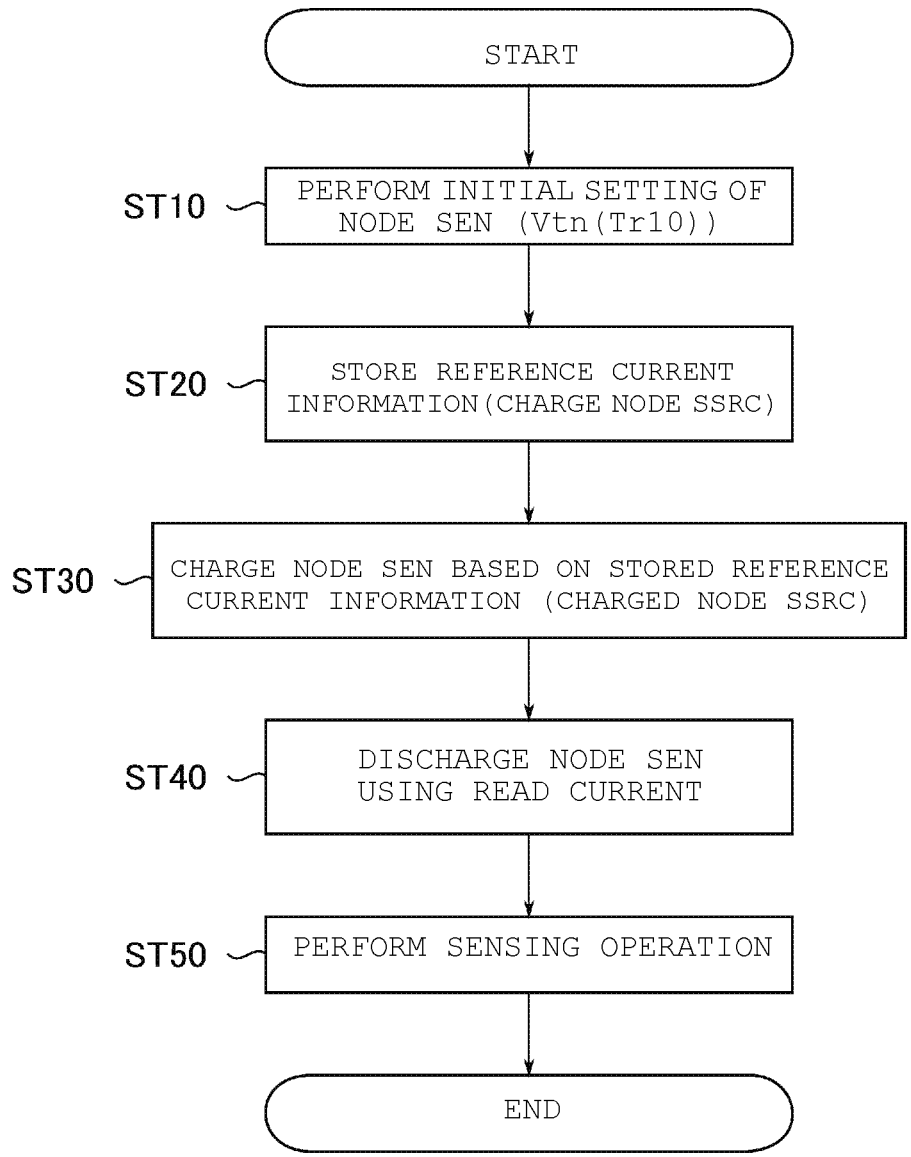
FIG. 9 is a flowchart illustrating a read operation in the semiconductor storage device according to the first embodiment.

FIG. 9 is a flowchart illustrating an outline of a read operation in the semiconductor storage device according to the first embodiment. Steps ST10 to ST50 illustrated in FIG. 9 are executed by the sense amplifier SA in accordance with, for example, an instruction given from the sequencer 170.

As illustrated in FIG. 9, in step ST10, the sense amplifier SA performs initial setting of the node SEN when a read operation is started. Specifically, the sense amplifier SA performs setting so that a voltage of the node SEN is set to a threshold voltage Vtn (Tr10) of the transistor Tr10.

In step ST20, the sense amplifier SA stores information corresponding to a reference current to the inside of the sense amplifier SA while applying the reference current to a selected memory string MS. Specifically, the sense amplifier SA charges the node SSRC on the basis of the reference current and holds a voltage of the node SSRC in a state where the reference current stably flows to the selected memory string MS. Details of the reference current will be described later.

In step ST30, the sense amplifier SA generates a current corresponding to the reference current on the basis of the information stored inside the sense amplifier SA, that is, on the basis of the voltage of the node SSRC charged in step ST20, and charges the node SEN.

In step ST40, the sense amplifier SA discharges the node SEN while applying a read current different from the reference current to the selected memory string MS. Details of the read current will be described later.

In step ST50, the sense amplifier SA senses a threshold voltage of a selected memory cell transistor MC on the basis of the voltage of the node SEN and stores a result of the sensing in the latch circuit SDL or the like.

Thereafter, an operation of reading data from the selected memory cell transistor MC using the reference current and the read current flowing to the selected memory string MS described above is terminated.

1.2.2 Timing Chart

Next, details of a read operation in the semiconductor storage device according to the first embodiment will be described using a timing chart.

1.2.2.1 Case of Lower Page Reading

First, a case of lower page reading through an operation BR will be described using a timing chart illustrated in FIG. 10 and schematic diagrams illustrated in FIGS. 11 to 16.

Figure 11:
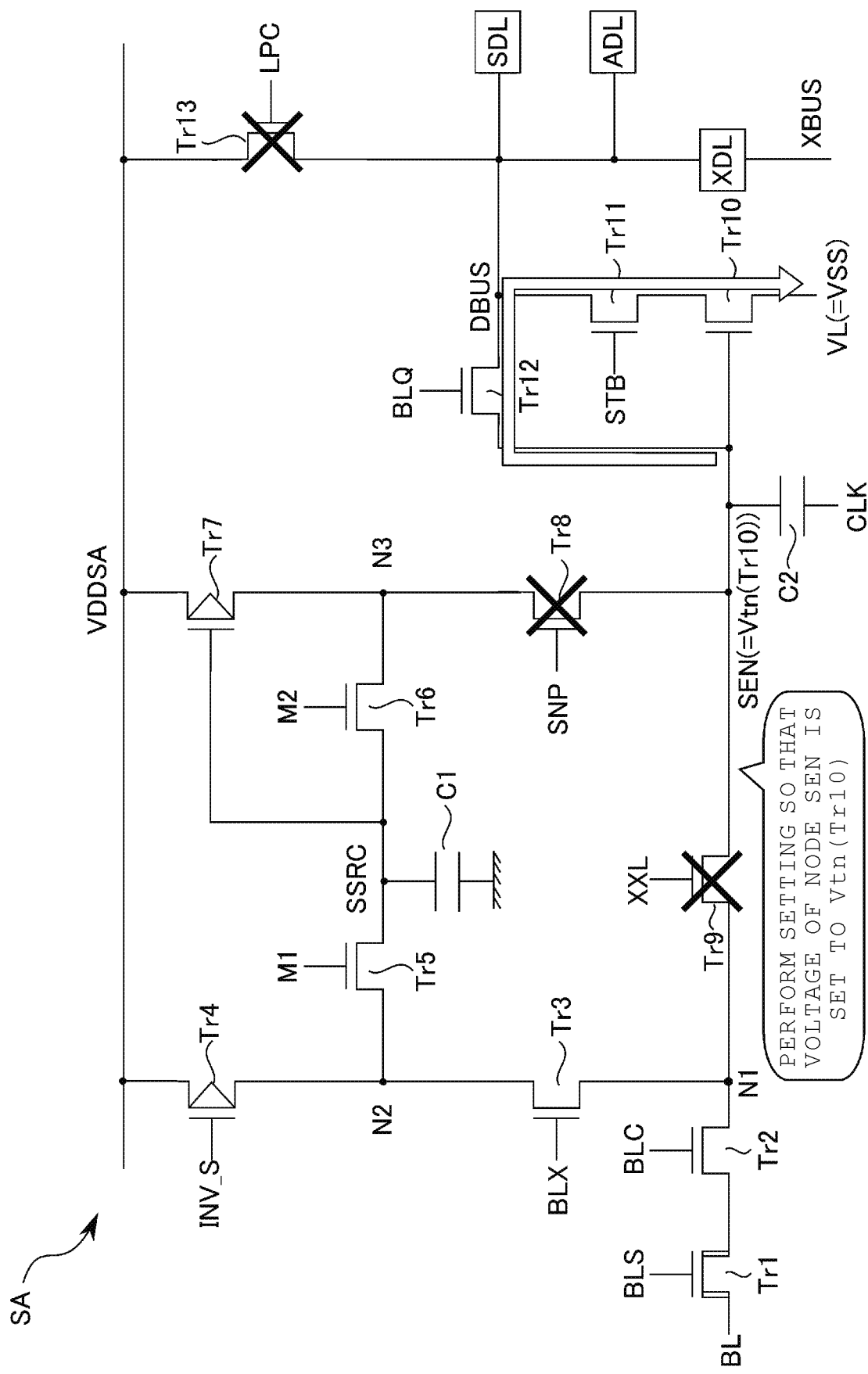
FIG. 11 is a schematic diagram illustrating an initial setting process of a sense node during a read operation in the semiconductor storage device according to the first embodiment.
Figure 12:
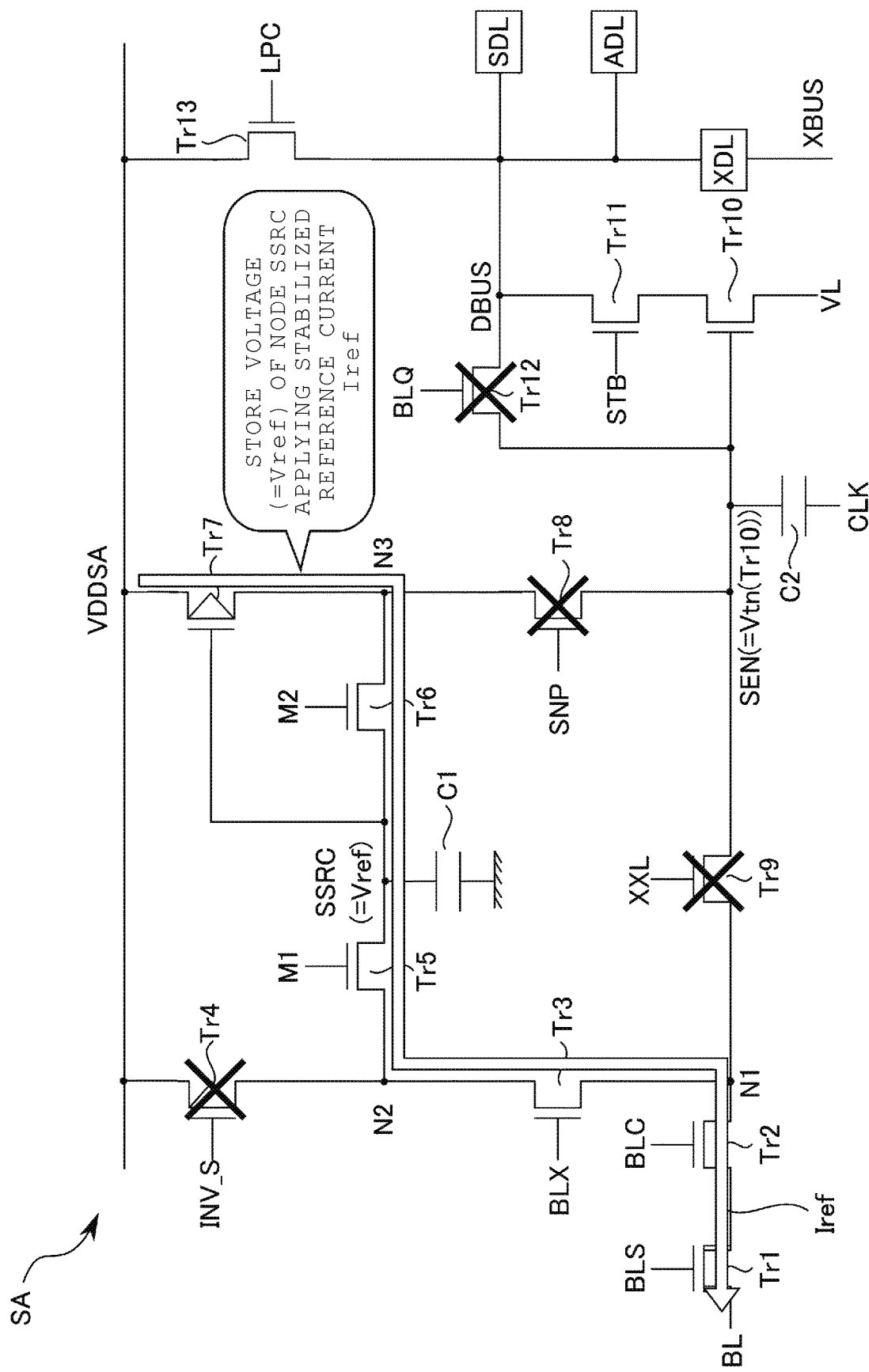
FIG. 12 is a schematic diagram illustrating a reference current information acquiring process during a read operation in the semiconductor storage device according to the first embodiment.
Figure 13:
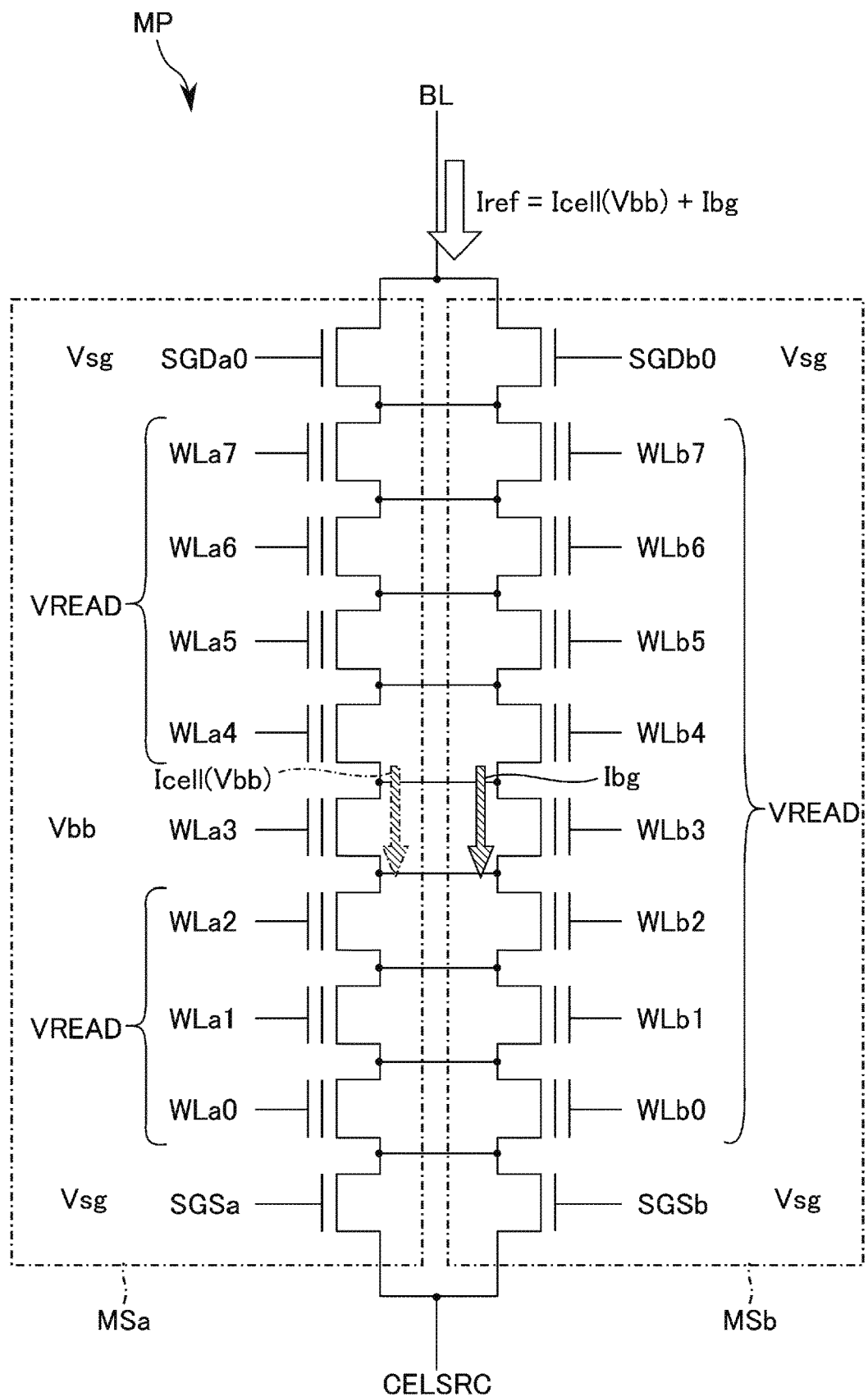
FIG. 13 is a schematic diagram illustrating a reference current flowing through a memory pillar at the time of a read operation in the semiconductor storage device according to the first embodiment.
Figure 14:
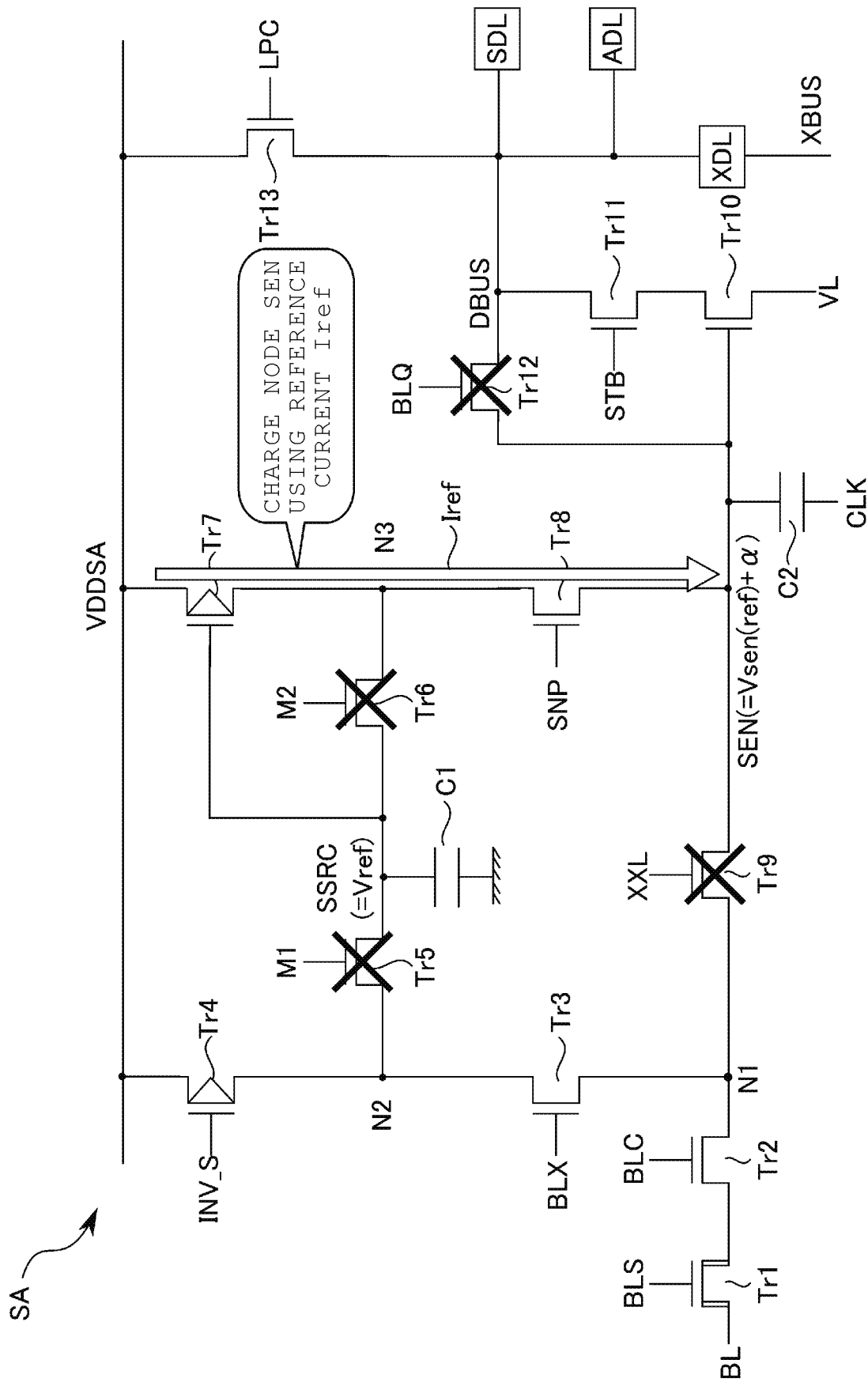
FIG. 14 is a schematic diagram illustrating a charging operation of a sense node using a reference current during a read operation in the semiconductor storage device according to the first embodiment.
Figure 15:
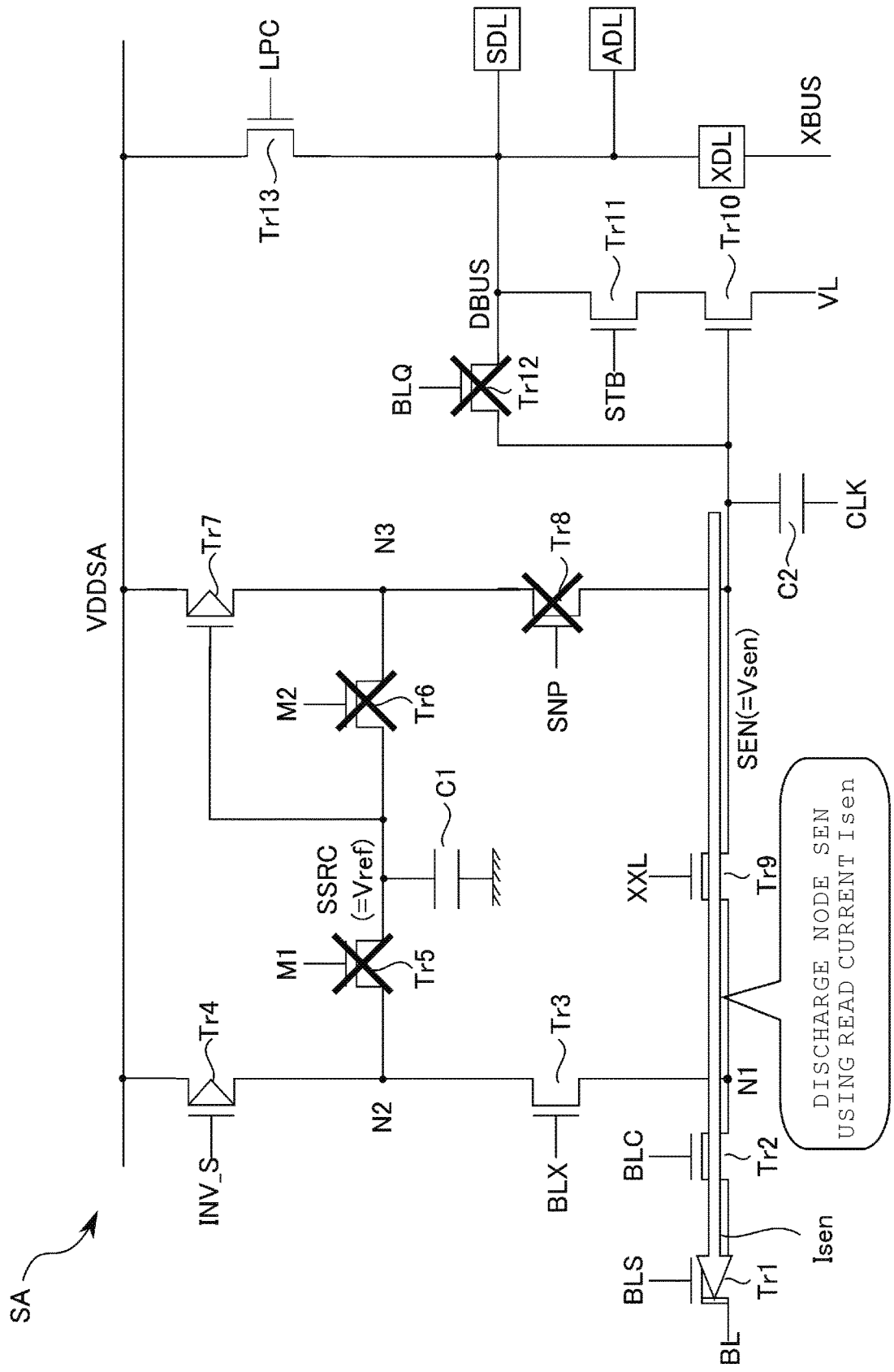
FIG. 15 is a schematic diagram illustrating a discharging operation of a sense node using a reference current during a read operation in the semiconductor storage device according to the first embodiment.
Figure 16:
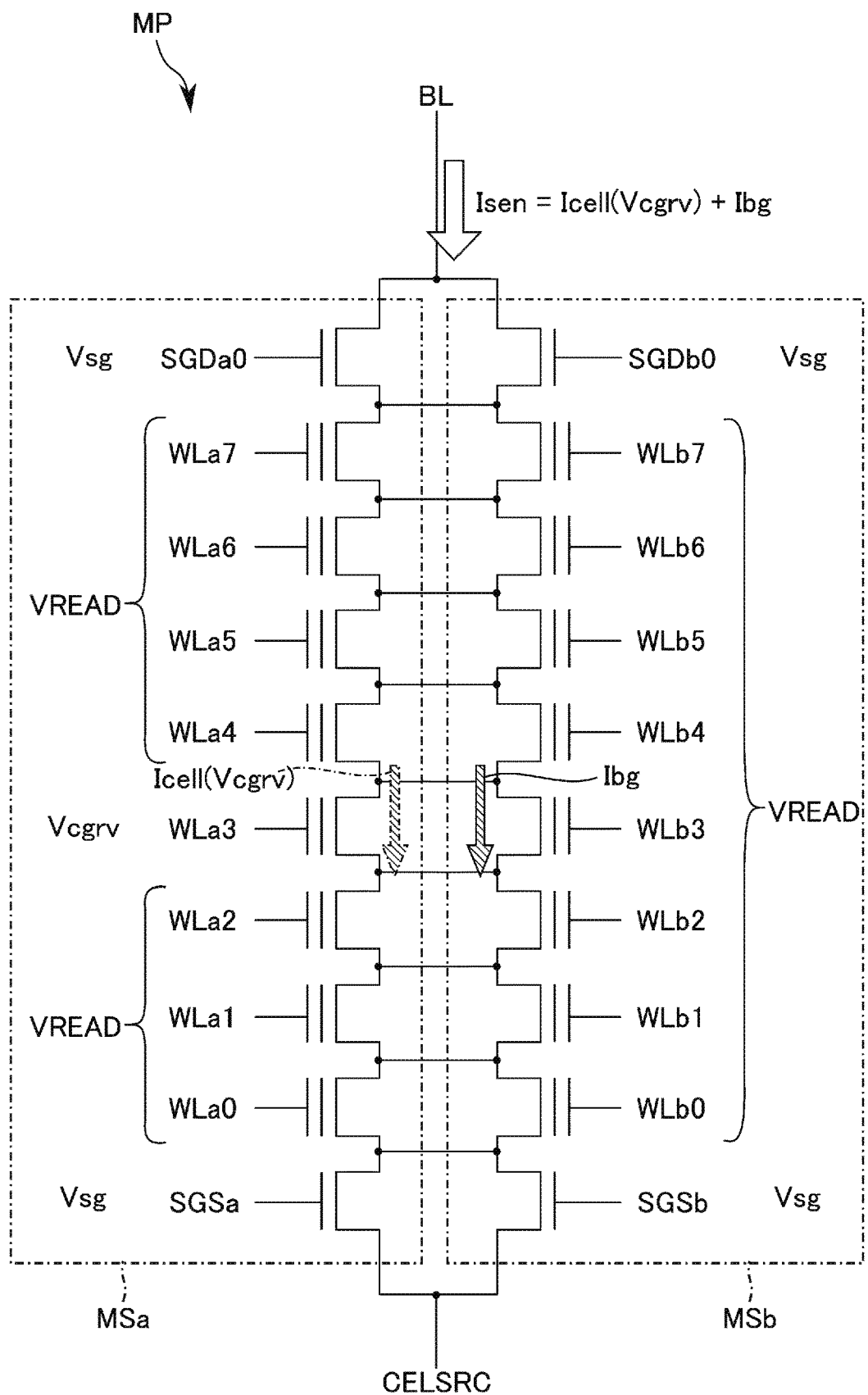
FIG. 16 is a schematic diagram illustrating a read current flowing through the memory pillar at the time of a read operation in the semiconductor storage device according to the first embodiment.

FIGS. 11, 12, 14, and 15 schematically illustrate a current path in the sense amplifier SA during a read operation, and FIGS. 13 and 16 schematically illustrate a current path in the memory pillar MP including the selected memory string MS during a read operation. Meanwhile, hereinafter, for convenience of description, description will be given on the assumption that a memory cell transistor MCa3 in the memory string MSa is selected.

Figure 10:
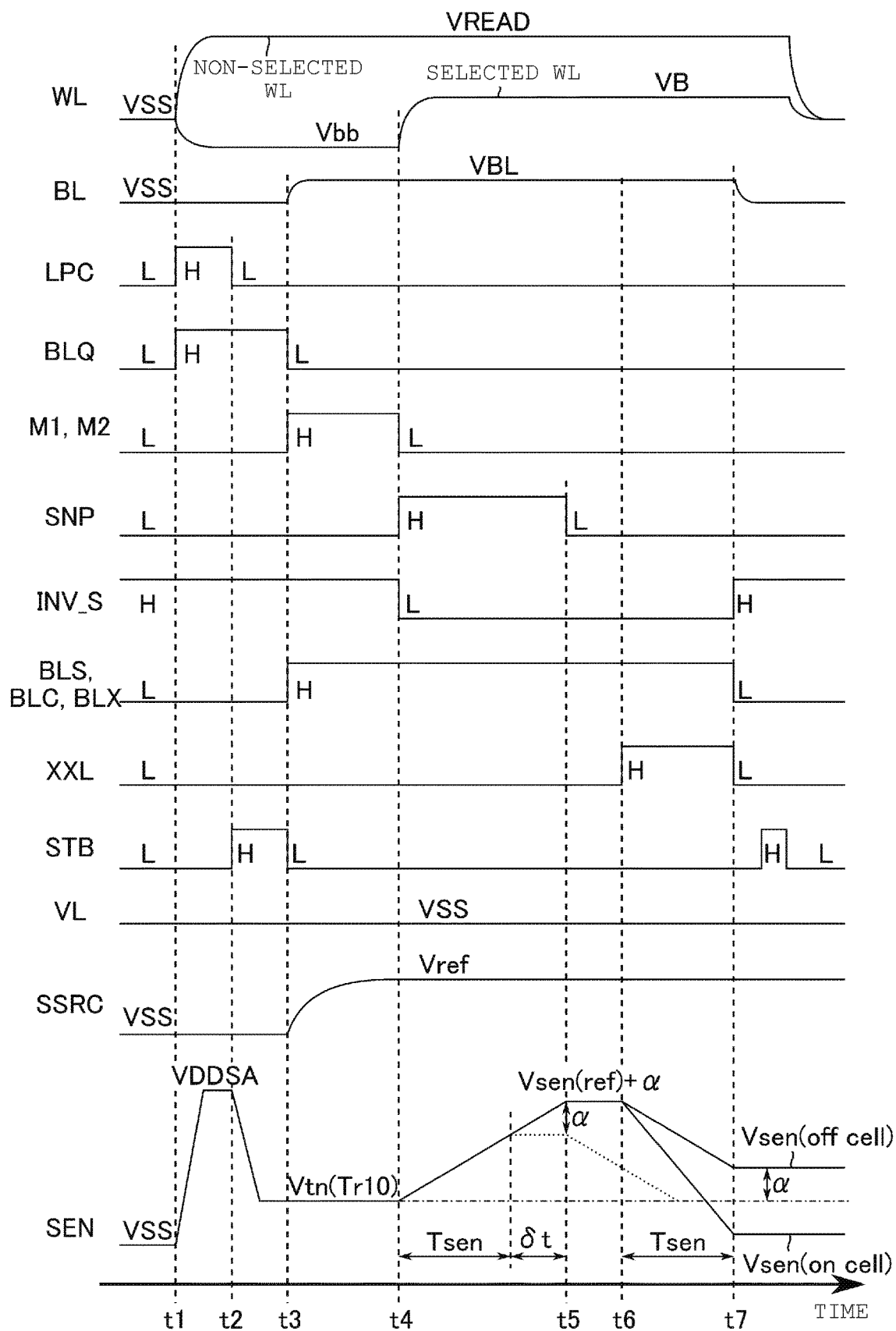
FIG. 10 is a timing chart illustrating an example of a lower page read operation in the semiconductor storage device according to the first embodiment.

As illustrated in FIG. 10, before time t1, for example, all of the transistors Tr1 to Tr6 and Tr8 to Tr13 in the sense amplifier SA except for the transistor Tr7 are set to be in an off state. In addition, after time t1, the node VL is grounded to a voltage VSS (for example, 0 V).

At time t1, a read operation is started. The sequencer 170 sets the signals BLQ and LPC to be in an "H" level to set the transistors Tr12 and Tr13 to be in an on state. Thereby, the node SEN is charged up to the voltage VDDSA, and the voltage VDDSA is stored in the node SEN by the capacitor C2.

In addition, the sequencer 170 controls the row decoder 120 or the like to supply the voltage Vbb to a selected word line WLa3 and supplies the voltage VREAD to non-selected word lines WL0a to WL2a, WL4a to WL7a, and WLb0 to WLb7. Meanwhile, supply of a voltage to various word lines WL by the row decoder 120 may be completed by time t3 to be described later and may not be necessarily started at time t1.

At time t2, the sequencer 170 sets the signal STB to be in an "H" level to set the transistor Tr11 to be in an on state while setting the signal LPC to be in an "L" level to set the transistor Tr13 to be in an off state. Thereby, as illustrated in FIG. 11, the node SEN is discharged through a current path including the transistors Tr12, Tr11, and Tr10, and a threshold voltage Vtn (Tr10) of the transistor Tr10 is stored in the node SEN by the capacitor C2.

At time t3, the sequencer 170 sets the signals BLS, BLC, BLX, M1, and M2 to be in an "H" level to set the transistors Tr1 to Tr3, Tr5, and Tr6 to be in an on state while setting the signals STB and BLQ to be in an "L" level to set the transistors Tr11 and Tr12 to be in an off state. Thereby, as illustrated in FIG. 12, a reference current Iref flows to a bit line BL through a current path including the transistors Tr7, Tr6, Tr5, and Tr3 to Tr1. Meanwhile, the voltage of the bit line BL is clamped to the voltage VBL using, for example, the signal BLC while the reference current Iref flows.

As illustrated in FIG. 13, the reference current Iref flowing to the bit line BL flows through the memory pillar MP including a selected memory string MSa. As described above, a voltage Vbb capable of setting the memory cell transistor MC to be in an off state, regardless of the state of a threshold voltage, is applied to the selected word line WLa3. However, a current Icell (Vbb) may flow to a selected memory cell transistor MCa3 even when the current is weak. In addition, a current Ibg may also flow to a non-selected memory cell transistor MCb3 which is a current path parallel to the selected memory cell transistor MCa3 in the memory pillar MP. In this manner, the reference current Iref flowing to the bit line BL at time t3 is the sum of the current Icell (Vbb) and the current Ibg which flow through current paths parallel to each other.

Meanwhile, the reference current Iref is stabilized as time elapses. Accordingly, the voltage of the node SSRC in the sense amplifier SA is charged up to a voltage Vref.

At time t4, the sequencer 170 sets the signals M1 and M2 to be in an "L" level to set the transistors Try and Tr6 to be in an off state. Thereby, the voltage Vref is held in the node SSRC by the capacitor C1, and a state where the voltage Vref is applied to the gate (that is, a state where the reference current Iref is applied) is held in the transistor Tr7. In addition, the sequencer 170 sets the signal SNP to be in an "H" level to set the transistor Tr8 to be in an on state. Thereby, as illustrated in FIG. 14, the node SEN is charged by the reference current Iref flowing through the transistors Tr7 and Tr8. As described above, since the voltage of the node SSRC is held at the voltage Vref, the reference current Iref flowing to the node SEN after time t4 has a fixed value.

For this reason, the voltage of the node SEN is charged at a fixed rate during a period in which the transistor Tr8 is in on state.

In addition, the row decoder 120 or the like is controlled to supply the voltage VB to the selected word line WLa3, and the voltage VREAD is continuously supplied to the non-selected word lines WL0a to WL2a, WL4a to WL7a, and WLb0 to WLb7. Meanwhile, supply of a voltage to various word lines WL by the row decoder 120 may be completed until time t6 to be described later, or may not be necessarily started at time t4.

Meanwhile, the sequencer 170 sets the signal INV_S to be in an "L" level to set the transistor Tr4 to be in on state. Thereby, the voltage of the bit line BL is continuously maintained at the voltage VBL.

After a period (Tsen+δt) elapses from time t4, that is, at time t4, the sequencer 170 sets the signal SNP to be in an "L" level to set the transistor Tr8 to be in an off state. Thereby, as in the following Expression (1), the node SEN is charged up to a voltage (Vsen (ref)+a) by the reference current Iref over the period (Tsen+δt), and the voltage (Vsen (ref)+α) is held in the node SEN by the capacitor C2.

[Expression 1]

$$Vsen(ref) + \alpha = Vtn(Tr10) + Iref \times (Tsen + \delta t)/C2 = \qquad (1)$$
$$Vtn(Tr10) + (Icell(Vbb) + Ibg) \times (Tsen + \delta t)/C2$$

Meanwhile, when a charging period of the node SEN is Tsen, the node SEN is charged up to a voltage Vsen (ref). In other words, as in the following Expression (2), the amount of increase of the node SEN according to the reference current Iref over a period δt is a margin α.

[Expression 2]

$$\alpha = (Icell(Vbb) + Ibg) \times \delta t/C2 \qquad (2)$$

At time t6, the sequencer 170 sets a signal XXL to be in an "H" level to set the transistor Tr9 to be in an on state. Thereby, as illustrated in FIG. 15, discharging through the transistors Tr9, Tr2, and Tr1 is started from the node SEN to the bit line BL, and accordingly, a read current Isen flows. While the read current Isen flows, the voltage of the bit line BL is clamped to the voltage VBL by the signal BLC, similar to a case where the reference current Iref flows.

As illustrated in FIG. 16, the read current Isen flowing to the bit line BL flows through the memory pillar MP including the selected memory string MSa. As described above, the voltage VB of which an on state and an off state change according to whether or not a threshold voltage is a "B" state or more is applied to the selected word line WLa3. For this reason, a current Icell (Vcgrv) according to a threshold voltage of the selected memory cell transistor MCa3 may flow to the selected memory cell transistor MCa3. In addition, since the voltage VREAD is applied to the non-selected word line WLb3 similar to a case of the reference current Iref, the current Ibg may flow similar to a case of the reference current Iref. In this manner, the read current Isen flowing to the bit line BL at time t6 is the sum of the current Icell (Vcgrv) and the current Ibg which flow through current paths parallel to each other.

As described above, since the voltage of the bit line BL is clamped to the voltage VBL, the read current Isen flowing to the node SEN after time t6 has a fixed value. For this reason, the voltage of the node SEN is discharged at a fixed rate during a period in which the transistor Tr9 is in an on state.

After a period Tsen elapses from time t6, that is, at time t7, the sequencer 170 sets the signals BLS, BLC, BLX, and XXL to be in an "L" level to set the transistors Tr1 to Tr3, and Tr9 to be in an off state while setting the signal INV_S to be in an "H" level to set the transistor Tr4 to be in an off state. Thereby, as in the following Expression (3), the node SEN is discharged up to the voltage Vsen by the read current Isen over the period Tsen, and the voltage Vsen is held in the node SEN by the capacitor C2.

[Expression 3]

$$Vsen = Vsen(ref) + \alpha - Isen \times Tsen/C2 = \qquad (3)$$
$$Vtn(Tr10) + \alpha + (Icell(Vbb) + Ibg) \times Tsen/C2 -$$
$$(Icell(Vcgrv) + Ibg) \times Tsen/C2 =$$
$$Vtn(Tr10) + \alpha + (Icell(Vbb) - Icell(Vcgrv)) \times Tsen/C2$$

Meanwhile, the current Icell (Vbb) is a current flowing to the selected memory cell transistor MCa3 being in an off state and is small enough to be negligible. In addition, the current Icell (Vcgrv) has a significant magnitude in a case where the selected memory cell transistor MCa3 is in an on state (on cell), but is small enough to be negligible in a case where the selected memory cell transistor is in an off state (off cell). For this reason, the voltage Vsen (on cell) in a case where the selected memory cell transistor MCa3 is an on cell and the voltage Vsen (off cell) of the node SEN in a case where the selected memory cell transistor MCa3 is an off cell are expressed by the following Expressions (4) and (5).

[Expression 4]

$$Vsen(\text{on cell}) \approx Vtn(Tr10) + \alpha - Icell(Vcgrv) \times Tsen/C2 \qquad (4)$$

$$Vsen(\text{off cell}) \approx Vtn(Tr10) + \alpha \qquad (5)$$

In this manner, it is possible to perform setting so that the voltage of the node SEN in a case where the selected memory cell transistor MCa3 is an off cell becomes larger than the threshold voltage Vtn (Tr10) of the transistor Tr10 by a margin α. In addition, it is possible to set the voltage Vsen so that terms except for the margin α, among terms constituting the voltage Vsen, do not include parameters depending on the current Ibg. For this reason, the transistor Tr10 is in an on state in a case where the selected memory cell transistor MCa3 is an off cell, and the transistor Tr10 is in an off state in a case where the selected memory cell transistor MCa3 is an on cell.

Thereafter, the sequencer 170 stores data based on the operation BR in the latch circuit SDL by setting the signal STB to be in an "H" level to set the transistor Tr11 to be in an on state.

After the above-described operations, the operation of reading lower page data from the selected memory cell transistor MCa3 using the read voltage VB is terminated.

1.2.2.2 Case of Upper Page Reading

Next, a case of upper page reading through operations AR and CR will be described using a timing chart illustrated in FIG. 17. Meanwhile, since FIG. 17 corresponds to FIG. 10 and a timing chart from time t1 to time t3 is the same as that in FIG. 10, the illustration is omitted. Further, in FIG. 17, for convenience of description, a timing chart related to the signals LPC, BLQ, and INV_S and the node VL is omitted.

First, a process based on the operation AR is executed. As illustrated in FIG. 17, an operation at time t3 and operations from time t10 to time t13 subsequent to time t3 are the same as the operations from time t3 to time t7 illustrated in FIG. 10 except that a voltage to be applied to a selected word line WL is the voltage VA. Further, in a period after time t13, the sequencer 170 stores data based on the operation AR in the latch circuit SDL by setting the signal STB to be in an "H" level to set the transistor Tr11 to be in an on state.

Subsequently, a process based on the operation CR is executed.

At time t14, the sense amplifier SA charges the node SEN to the voltage VDDSA again while resetting the voltage of the node SSRC to the voltage VSS.

In addition, the sequencer 170 controls the row decoder 120 or the like to supply the voltage Vbb to the selected word line WLa3, and continuously supplies the voltage VREAD to the non-selected word lines WL0$a$ to WL2$a$, WL4$a$ to WL7$a$, and WLb0 to WLb7. Meanwhile, supply of a voltage to various word lines WL by the row decoder 120 may be completed until time t16 to be described later, or may not be necessarily started at time t14.

At time t15, the sequencer 170 sets the signal STB to be in an "H" level to set the transistor Tr11 to be in an on state while setting the signal LPC to be in an "L" level to set the transistor Tr13 to be in an off state. Thereby, the node SEN is discharged through a current path including the transistors Tr12, Tr11, and Tr10, and the voltage Vtn (Tr10) is held in the node SEN by the capacitor C2.

At time t16, the sequencer 170 sets the signals BLS, BLC, BLX, M1, and M2 to be in an "H" level to set the transistors Tr1 to Tr3, Try, and Tr6 to be in an on state while setting the signals STB and BLQ to be in an "L" level to set the transistors Tr11 and Tr12 to be in an off state. Thereby, the reference current Iref flows to the bit line BL through a current path including the transistors Tr7, Tr6, Try, and Tr3 to Tr1, and the voltage of the node SSRC is charged to the voltage Vref again.

Operations from time t17 to time t20 subsequent to time t16 are the same as the operations from time t10 to time t13 except that a voltage to be applied to a selected word line WL is the voltage VC. Further, in a period after time t20, the sequencer 170 stores data based on the operation CR in the latch circuit ADL by setting the signal STB to be in an "H" level to set the transistor Tr11 to be in an on state. The sequencer 170 generates upper page data on the basis of the data stored in the latch circuits SDL and ADL.

After the above-described operations, the operation of reading upper page data from the selected memory cell transistor MCa3 using the read voltages VA and VC is terminated.

Figure 17:
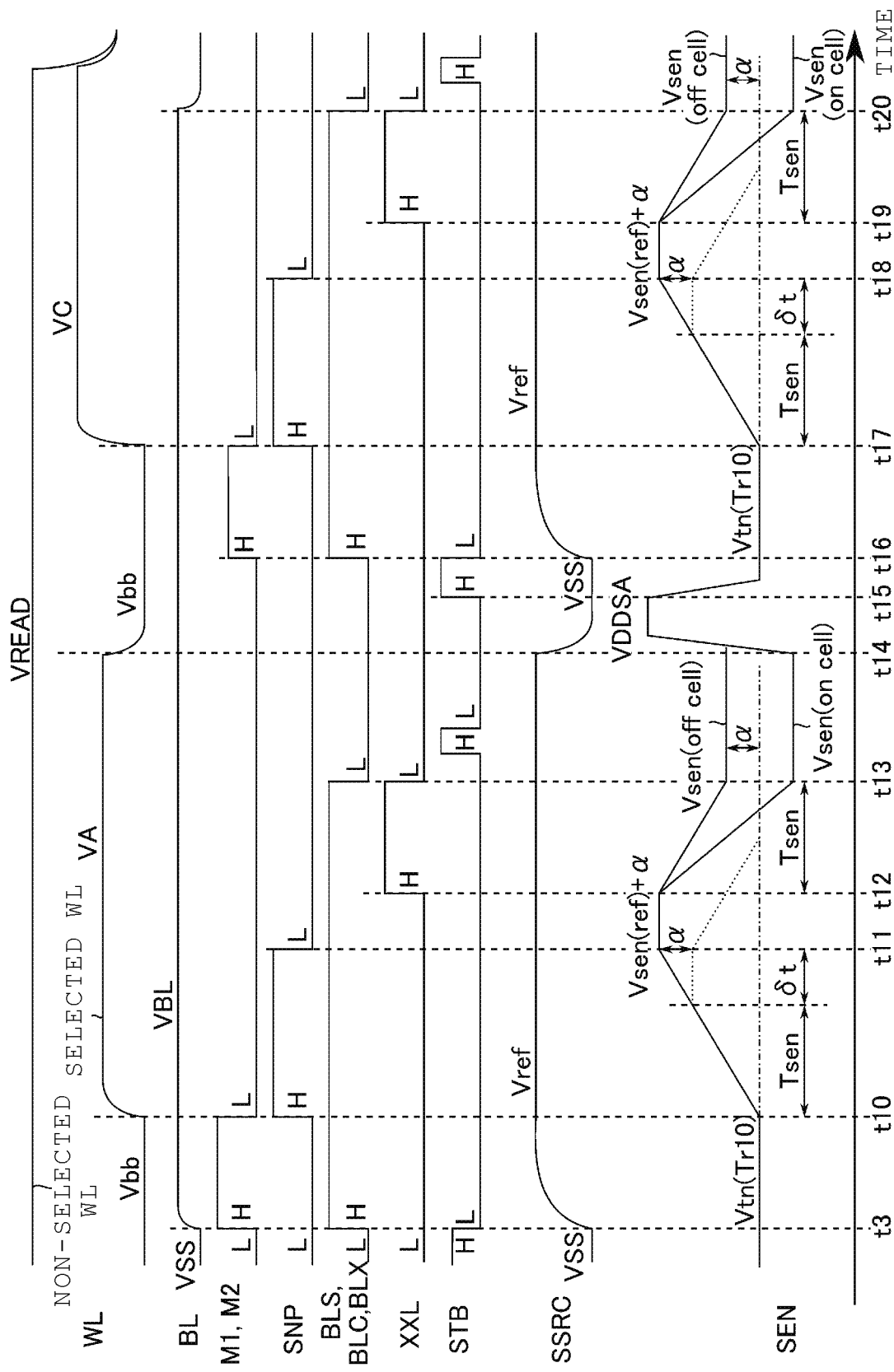
FIG. 17 is a timing chart illustrating an example of an upper page read operation in the semiconductor storage device according to the first embodiment.

Meanwhile, in the example of FIG. 17, a case where an operation of charging the node SSRC to the voltage Vref is executed every time the read voltage Vcgrv is changed is described, but this is not a limiting example. For example, in a case where the voltage of the node SSRC is charged to the voltage Vref at the time of the operation AR and then is maintained until the operation CR is terminated, an operation of charging the node SSRC to the voltage Vref may be executed only once at the beginning when upper page reading is performed. A read operation in that case will be described using a timing chart illustrated in FIG. 18.

Figure 18:
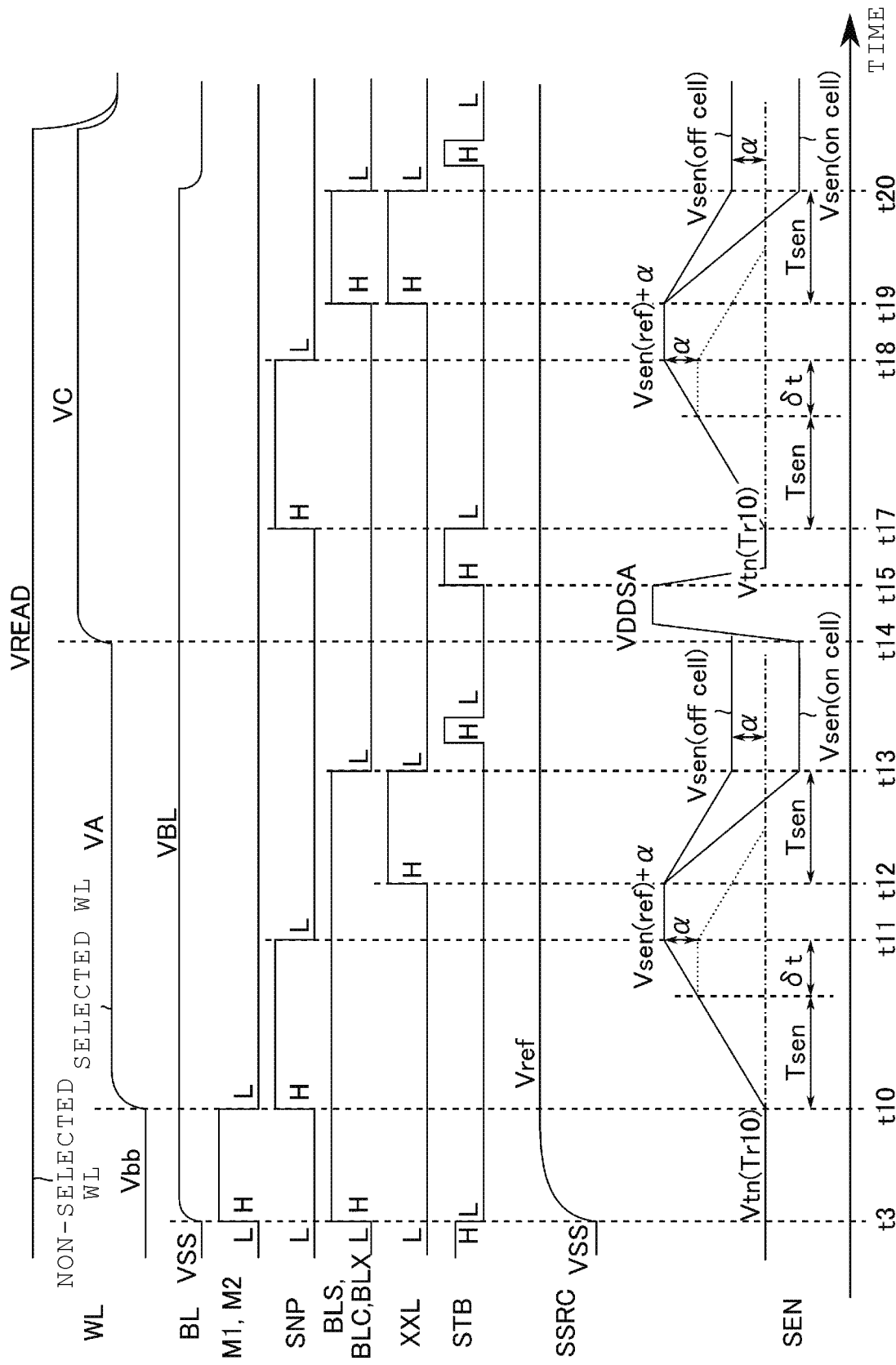
FIG. 18 is a timing chart illustrating another example of an upper page read operation in the semiconductor storage device according to the first embodiment.

As illustrated in FIG. 18, operations until time t14 are the same as those in FIG. 17, and thus description thereof will be omitted.

At time t14, the sense amplifier SA charges the node SEN to the voltage VDDSA again while maintaining the voltage Vref without resetting the voltage of the node SSRC to the voltage VSS.

In addition, the sequencer 170 controls the row decoder 120 or the like to supply the voltage Vbb to the selected word line WLa3 and continuously supplies the voltage VREAD to the non-selected word lines WL0$a$ to WL2$a$, WL4$a$ to WL7$a$, and WLb0 to WLb7. Meanwhile, supply of a voltage to various word lines WL by the row decoder 120 may be completed by time t16 to be described later and may not be necessarily started at time t14.

At time t15, the sequencer 170 sets the signal STB to be in an "H" level to set the transistor Tr11 to be in an on state while setting the signal LPC to be in an "L" level to set the transistor Tr13 to be in an off state. Thereby, the node SEN is discharged up to the threshold voltage Vtn (Tr10) of the transistor Tr10 through a current path including the transistors Tr12, Tr11, and Tr10, and the voltage Vtn (Tr10) is held in the node SEN by the capacitor C2.

The sequencer 170 starts an operation of charging the node SEN by the reference current Iref based on the voltage Vref held in the node SSRC (through the transistor Tr8) without applying the reference current Iref to the bit line BL after time t15. That is, the sequencer 170 proceeds to an operation at time t17 without executing an operation at time t16 in FIG. 17 after the operation at time t15.

Operations from time t17 to time t20 are the same as those in FIG. 17, and thus description thereof will be omitted. Further, in a period after time t20, the sequencer 170 stores data based on the operation CR in the latch circuit ADL by setting the signal STB to be in an "H" level to set the transistor Tr11 to be in an on state. The sequencer 170 generates upper page data on the basis of the data stored in the latch circuits SDL and ADL.

With the above-described operations, a sensing operation reducing the influence of the current Ibg by applying the reference current Iref to a selected memory string MS only once can be executed for the two operations AR and CR.

1.3 Effects According to the Present Embodiment

According to the first embodiment, it is possible to prevent erroneous reading of data. The effects will be described below.

In a case where data is read from the memory cell array 110 in the NAND-type flash memory 100, a read current Icell is applied into the memory string MS in which the plurality of memory cell transistors MC are connected to each other in series. The read current Icell changes depending on whether or not a selected memory cell transistor MC is set to be in an on state by a read voltage Vcgrv applied to a selected word line WL. That is, a large read current Icell flows to the selected memory cell transistor MC in a case of an on state, and the read current Icell hardly flows in a case of an off state. The sense amplifier SA can sense a threshold voltage of the selected memory cell transistor MC in accordance with the magnitude of the read current Icell and can read data.

In the first embodiment, two memory strings MS are formed in one memory pillar MP. In this case, in order to correctly read data from a selected memory cell transistor MC (for example, MCa3), it is preferable that the influence of a current Ibg flowing to a non-selected memory cell transistor MC (for example, MCb3) formed in the same layer as the selected memory cell transistor MC be removed. However, in a case where the non-selected memory cell transistor MCb3 is set to be in an off state, the current Ibg can be reduced, but there is a possibility that the read current Icell will change due to the influence of charge accumulated in the charge storage layer 33b in the non-selected memory cell transistor MCb3. On the other hand, in a case where the non-selected memory cell transistor MCb3 is set to be in an on state, it is possible to reduce the influence of charge accumulated in the charge storage layer 33b in the non-selected memory cell transistor MCb3 on the read current Icell, but a large current Ibg may flow.

According to the first embodiment, in the sense amplifier SA, the node SSRC is formed by the transistors Try and Tr6 having an n-type polarity, the transistor Tr7 having a p-type polarity, and the capacitor C1. Thereby, the node SSRC can have a function of storing the magnitude of a current flowing to the memory pillar MP through the transistor Tr7. In addition, the sense amplifier SA includes the transistor Tr8 connected between the transistor Tr7 and the node SEN. Thereby, it is possible to apply a current stored by the node SSRC to the node SEN through the transistor Tr8.

In addition, according to the first embodiment, the sequencer 170 executes the following operations on the basis of the sense amplifier SA having the above-described configuration. That is, the sequencer 170 applies a reference current Iref (=Icell (Vbb)+Ibg) to the memory pillar MP in a state where the voltage VREAD is applied to other non-selected word lines WL in the memory pillar MP while applying the voltage Vbb to a selected word line WL. The sense amplifier SA fixes a current flowing to the transistor Tr7 to the reference current Iref by storing the voltage Vref in the node SSRC on the basis of the reference current Iref. After the reference current Iref applied to the memory pillar MP is stopped, the sense amplifier SA applies the reference current Iref on the basis of the voltage Vref to charge the node SEN. Thereafter, the sequencer 170 applies a read current Isen (=Icell (Vcgrv)+Ibg) to the memory pillar MP in a state where the voltage VREAD is applied to other non-selected word lines WL in the memory pillar MP while applying the read voltage Vcgrv to a selected word line WL. In this case, the sense amplifier SA discharges the node SEN by the read current Isen. Thereby, the voltage Vsen of the node SEN is set by charging using the reference current Iref including the influence of the current Ibg and discharging using the read current Isen similarly including the influence of the current Ibg. For this reason, it is possible to drastically remove the influence of the current Ibg from the voltage Vsen of the node SEN.

More specifically, the voltage of the node SEN is charged for a period (Tsen+δt) by the reference current Iref from a state where initial setting of the node to the voltage Vtn (Tr10) is performed to become a voltage Vsen (ref)+cc, and the voltage of the node SEN is discharged for a period Tsen by the read current Isen to become a voltage Vsen. The value of the voltage Vsen is as shown in the above-described Expressions (4) and (5), and the influence of the current Ibg is removed except for the term of a margin α. For this reason, it is possible to sense a threshold voltage of a selected memory cell transistor MC on the basis of the voltage Vsen in which the influence of the current Ibg is reduced. Therefore, it is possible to prevent erroneous reading of data.

2. Second Embodiment

Next, a semiconductor storage device according to a second embodiment will be described. In the first embodiment, a case where initial setting of the voltage of the node SEN to the voltage Vtn (Tr10) before the node SEN is charged using the reference current Iref is described, but this is not a limiting example. For example, a sense amplifier SA may offset a voltage of a node SEN from a voltage Vtn (Tr10) by a margin α' before the node SEN is charged using a reference current Iref.

Meanwhile, in the following description, the same configurations and operations as those in the first embodiment will not be described, and configurations and operations different from those in the first embodiment will be mainly described.

2.1 Flowchart

Figure 19:
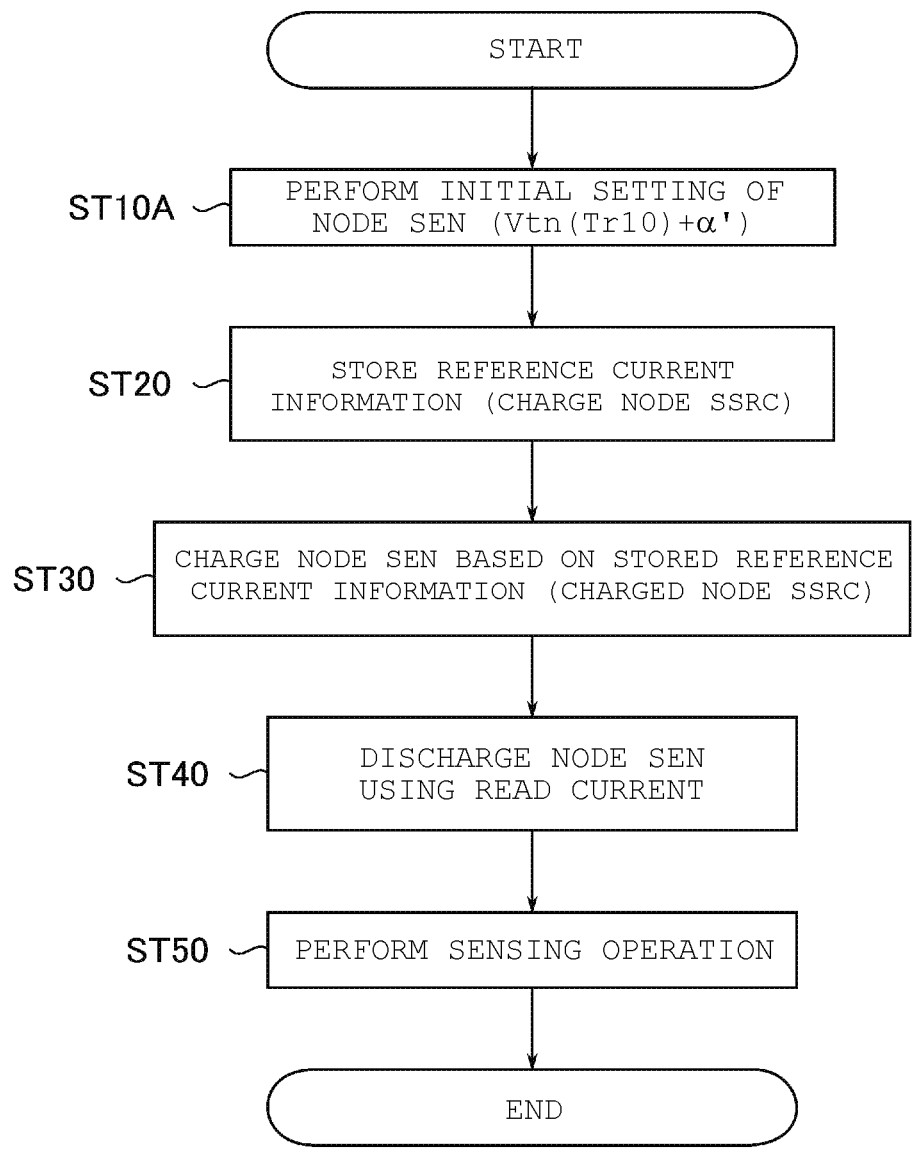
FIG. 19 is a flowchart illustrating a read operation in a semiconductor storage device according to a second embodiment.

FIG. 19 is a flowchart illustrating an outline of a read operation in the semiconductor storage device according to the second embodiment. Steps ST10A to ST50 illustrated in FIG. 19 correspond to steps ST10 to ST50 illustrated in FIG. 9.

As illustrated in FIG. 19, in step ST10A, a sense amplifier SA performs initial setting of a node SEN when a read operation is started. Specifically, the sense amplifier SA performs setting so that a voltage of the node SEN is offset from a threshold voltage Vtn (Tr10) of a transistor Tr10 by a margin α'.

Meanwhile, basic operations of the sense amplifier SA in the subsequent steps ST20 to ST50 are the same as those in FIG. 9, and thus description thereof will be omitted.

Thereafter, the operation of reading data from a selected memory cell transistor MC using a reference current and a read current that flow to a selected memory string MS is terminated.

2.2 Timing Chart

Next, details of a read operation in the semiconductor storage device according to the second embodiment will be described.

Figure 20:
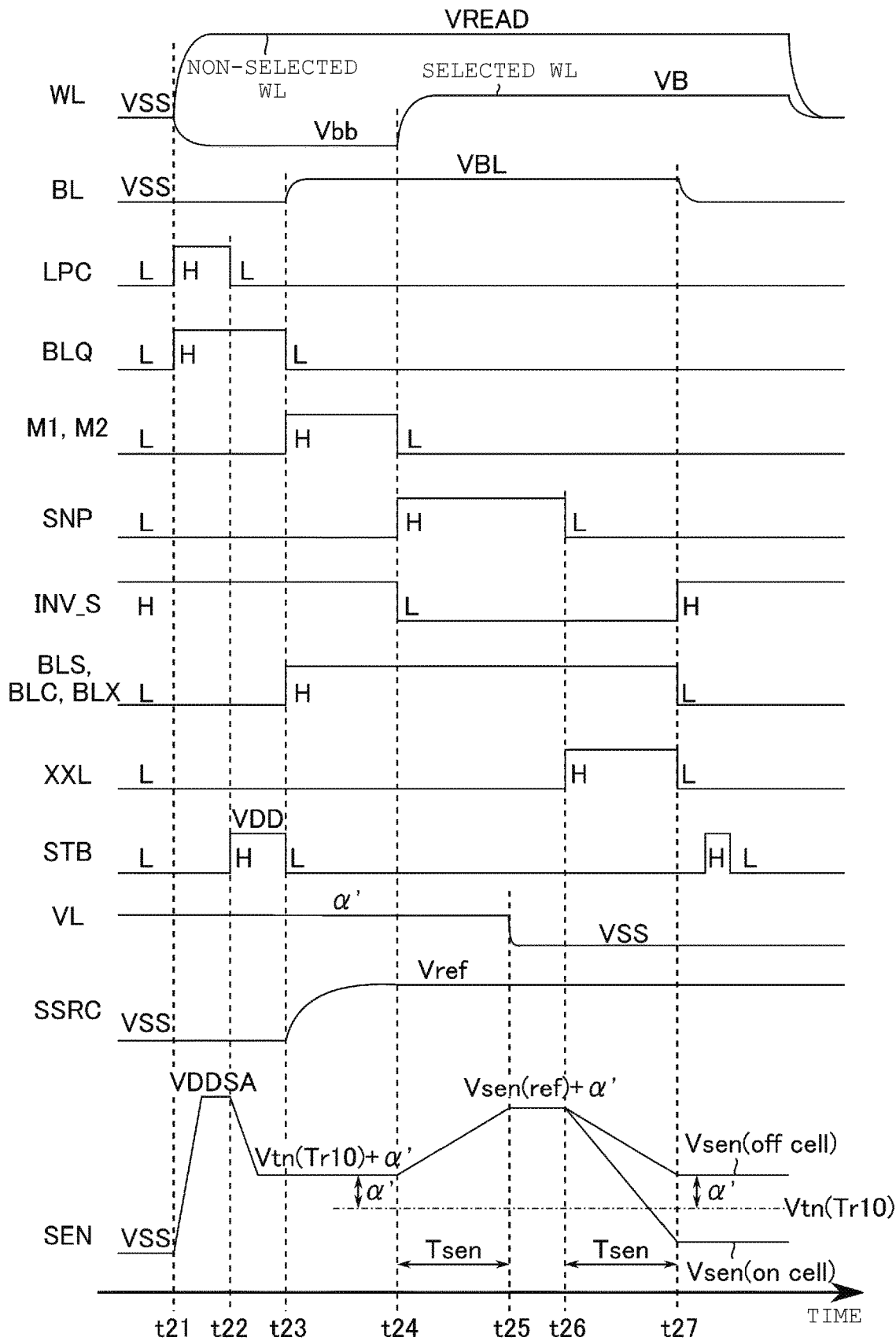
FIG. 20 is a timing chart illustrating an example of a lower page read operation in the semiconductor storage device according to the second embodiment.
Figure 21:
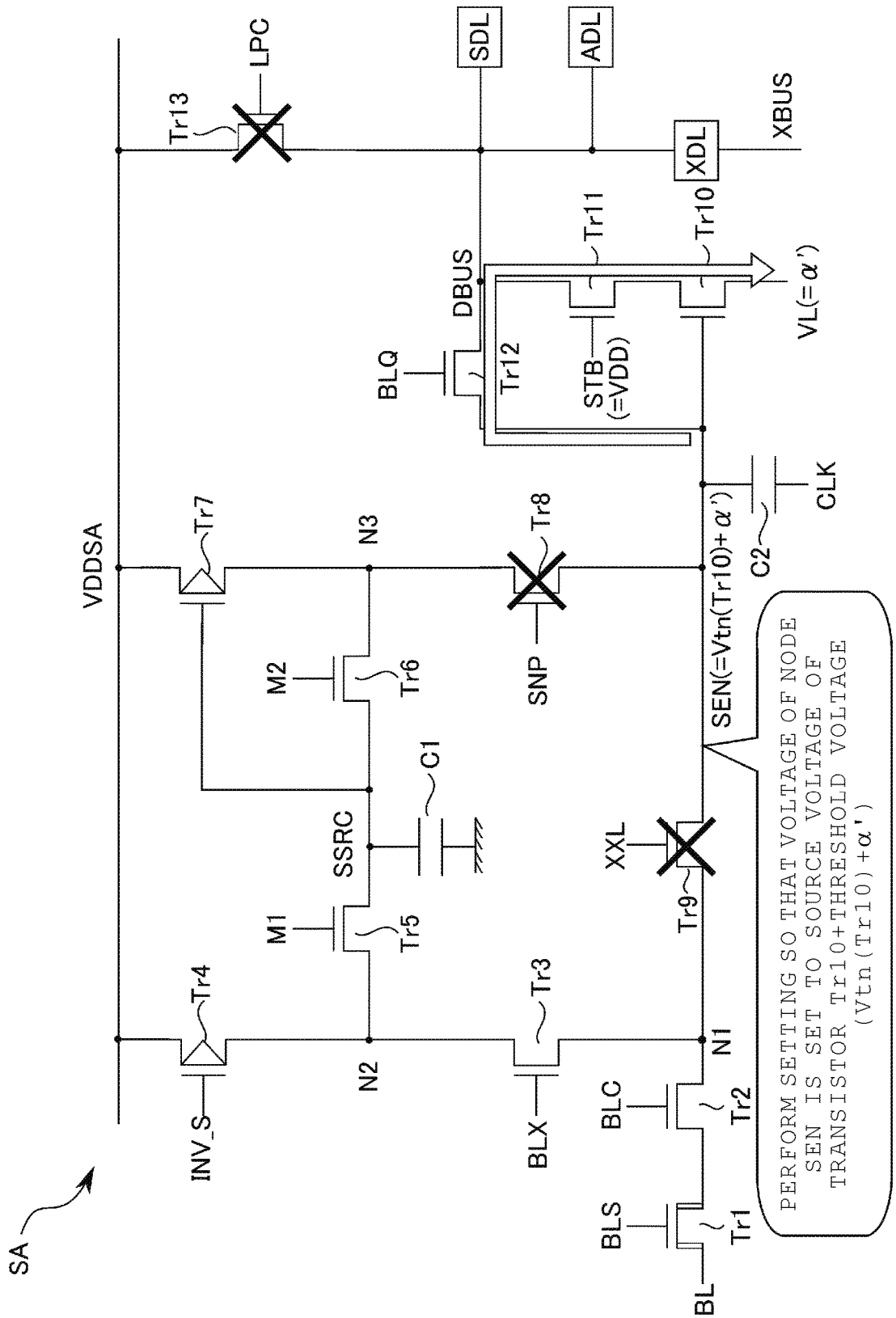
FIG. 21 is a schematic diagram illustrating an initial setting process of a sense node during a read operation in the semiconductor storage device according to the second embodiment.

Hereinafter, a case of lower page reading through an operation BR will be described using a timing chart illustrated in FIG. 20 and a schematic diagram illustrated in FIG. 21. FIGS. 20 and 21 respectively correspond to FIGS. 10 and 11 described in the first embodiment.

As illustrated in FIG. 20, before time t21, for example, all of transistors Tr1 to Tr6 and Tr8 to Tr13 in the sense amplifier SA except for a transistor Tr7 are set to be in an off state. In addition, a node VL is grounded to a voltage (margin) a' (>VSS) after time t1 and until a sensing operation is executed. The margin α' is ultimately a margin when a threshold voltage of a selected memory cell transistor MCa3 is sensed on the basis of the voltage of the node SEN. That is, the margin α' corresponds to the margin α in the first embodiment.

At time t21, a read operation is started. A sequencer 170 sets signals BLQ and LPC to be in an "H" level to set transistors Tr12 and Tr13 to be in an on state. Thereby, the node SEN is charged up to a voltage VDDSA, and the voltage VDDSA is held in the node SEN by a capacitor C2.

In addition, the sequencer 170 controls a row decoder 120 or the like to supply a voltage Vbb to a selected word line WLa3 and supplies a voltage VREAD to non-selected word lines WL0a to WL2a, WL4a to WL7a, and WLb0 to WLb7. Meanwhile, supply of a voltage to various word lines WL by the row decoder 120 may be completed by time t23 to be described later and may not be necessarily started at time t21.

At time t22, the sequencer 170 sets a signal STB to be in an "H" level to set the transistor Tr11 to be in an on state while setting the signal LPC to be in an "L" level to set the transistor Tr13 to be in an off state. Here, the sequencer 170 sets the signal STB in an "H" level to be at a voltage VDD. The voltage VDD is a power voltage and is larger than a voltage Vtn (Tr10)+a'. Thereby, as illustrated in FIG. 21, the voltage of the node SEN is set to be a voltage (Vtn (Tr10)+α') which is higher than the threshold voltage Vtn (Tr10) of the transistor Tr10 by a margin α'.

At time t23, the sequencer 170 sets signals BLS, BLC, BLX, M1, and M2 to be in an "H" level to set the transistors Tr1 to Tr3, Try, and Tr6 to be in an on state while setting signals STB and BLQ to be in an "L" level to set the transistors Tr11 and Tr12 to be in an off state. Thereby, a reference current Iref flows to a bit line BL through a current path including the transistors Tr7, Tr6, Try, and Tr3 to Tr1. Thereby, a voltage of a node SSRC in the sense amplifier SA is charged up to a voltage Vref. Meanwhile, the voltage of the bit line BL is clamped to a voltage VBL using, for example, the signal BLC while the reference current Iref flows.

At time t24, the sequencer 170 sets signals M1 and M2 to be in an "L" level to set the transistors Try and Tr6 to be in an off state. Thereby, the voltage Vref is held in a node SSRC by a capacitor C1, and a state where the voltage Vref is applied to the gate (that is, a state where the reference current Iref is applied) is held in the transistor Tr7. In addition, the sequencer 170 sets the signal SNP to be in an "H" level to set the transistor Tr8 to be in an on state. Thereby, the node SEN is charged by the reference current Iref flowing through the transistors Tr7 and Tr8. As described above, since a voltage of a node SSRC is held at the voltage Vref, the reference current Iref flowing to the node SEN after time t24 has a fixed value. For this reason, the voltage of the node SEN is charged at a fixed rate during a period in which the transistor Tr8 is in an on state.

In addition, the row decoder 120 or the like is controlled to supply a voltage VB to a selected word line WLa3, and a voltage VREAD is continuously supplied to the non-selected word lines WL0a to WL2a, WL4a to WL7a, and WLb0 to WLb7. Meanwhile, supply of a voltage to various word lines WL by the row decoder 120 may be completed until time t26 to be described later, or may not be necessarily started time t24.

Meanwhile, the sequencer 170 sets a signal INV_S to be in an "L" level to set the transistor Tr4 to be in on state. Thereby, the voltage of the bit line BL is continuously maintained at the voltage VBL.

After a period Tsen elapses from time t24, that is, at time t25, the sequencer 170 sets the signal SNP to be in an "L" level to set the transistor Tr8 to be in an off state. Thereby, as in the following Expression (6), the node SEN is charged up to a voltage (Vsen (ref)+cc') by the reference current Iref over the period Tsen, and the voltage (Vsen (ref)+α') is held in the node SEN by the capacitor C2.

[Expression 5]

$$Vsen(ref) + \alpha' = Vtn(Tr10) + \alpha' + Iref \times Tsen/C2 = \qquad (6)$$
$$Vtn(Tr10) + \alpha' + (Icell(Vbb) + Ibg) \times Tsen/C2$$

In addition, the sequencer 170 changes a ground voltage of the node VL to a voltage VSS. Thereby, in the subsequent sensing operation, it is possible to perform determination according to whether or not the voltage of the node SEN is higher than the voltage Vtn (Tr10). Meanwhile, the operation may be completed by a sensing operation to be described later and may not be necessarily started at time t25.

At time t26, the sequencer 170 sets a signal XXL to be in an "H" level to set the transistor Tr9 to be in an on state. Thereby, discharging through the transistors Tr9, Tr2, and Tr1 is started from the node SEN to the bit line BL, and accordingly, a read current Isen flows. Since the voltage of the bit line BL is clamped to the voltage VBL, the read current Isen flowing to the node SEN after time t26 has a fixed value. For this reason, the voltage of the node SEN is discharged at a fixed rate during a period in which the transistor Tr9 is in an on state.

After a period Tsen elapses from time t26, that is, at time t27, the sequencer 170 sets the signals BLS, BLC, BLX, and XXL to be in an "L" level to set the transistors Tr1 to Tr3, and Tr9 to be in an off state while setting the signal INV_S to be in an "H" level to set the transistor Tr4 to be in an off state. Thereby, as in the following Expression (7), the node SEN is discharged up to the voltage Vsen by the read current Isen over the period Tsen, and the voltage Vsen is held in the node SEN by the capacitor C2.

[Expression 6]

$$Vsen = Vsen(ref) + \alpha' - Isen \times Tsen/C2 = \qquad (7)$$
$$Vtn(Tr10) + \alpha' + (Icell(Vbb) + Ibg) \times Tsen/C2 -$$
$$(Icell(Vcgrv) + Ibg) \times Tsen/C2 =$$
$$Vtn(Tr10) + \alpha' + (Icell(Vbb) - Icell(Vcgrv)) \times Tsen/C2$$

For this reason, a voltage Vsen (on cell) in a case where the selected memory cell transistor MCa3 is an on cell and the voltage Vsen (off cell) of the node SEN in a case where the selected memory cell transistor MCa3 is an off cell are expressed by the following Expressions (8) and (9).

[Expression 7]

$$Vsen(\text{on cell}) \approx Vtn(Tr10) + \alpha' - Icell(Vcgrv) \times Tsen/C2 \qquad (8)$$

$$Vsen(\text{off cell}) \approx Vtn(Tr10) + \alpha' \qquad (9)$$

In this manner, it is possible to perform setting so that the voltage of the node SEN in a case where the selected memory cell transistor MCa3 is an off cell becomes larger than the threshold voltage Vtn (Tr10) of the transistor Tr10 by a margin α'. As described above, the margin α' is a ground voltage to be supplied to the node VL and can be set regardless of a current Ibg. For this reason, it is possible to set the voltage Vsen so as not to include parameters depending on the current Ibg.

Thereafter, the sequencer 170 stores data based on the operation BR in the latch circuit SDL by setting the signal STB to be in an "H" level to set the transistor Tr11 to be in an on state.

After the above-described operations, the operation of reading lower page data from the selected memory cell transistor MCa3 using the read voltage VB is terminated.

2.3 Effects According to the Present Embodiment

According to the second embodiment, the sequencer 170 grounds the node VL to a margin α' when initial setting of the node SEN is performed. Thereby, prior to an operation of charging the node SEN using the reference current Iref, the voltage of the node SEN can be offset to a voltage which is higher than the voltage Vtn (Tr10) by the margin α'.

Thereby, both a period required for an operation of charging the node SEN using the reference current Iref and a period required for an operation of discharging the node SEN using the read current Isen can be set to be the same period Tssen. For this reason, since it is not necessary to control the voltage of the node SEN depending on a period, it is possible to reduce a control load of the voltage Vsen.

In addition, the margin α' is a voltage which can be set regardless of the reference current Iref and the read current Isen which flow through the memory pillar MP. For this reason, the voltage Vsen of the node SEN can be set regardless of the current Ibg. Therefore, it is possible to prevent erroneous reading of data.

3. Third Embodiment

Next, a semiconductor storage device according to a third embodiment will be described. In the second embodiment, a case where initial setting of the voltage of the node SEN to the voltage Vtn (Tr10)+α' by increasing the voltage of the node VL from the voltage VSS is described. In the third embodiment, a case where initial setting of a node SEN to a voltage Vtn (Tr10)+α' is performed without increasing the voltage of the node VL from the voltage VSS will be described.

Meanwhile, in the following description, the same configurations and operations as those in the second embodiment will not be described, and configurations and operations different from those in the second embodiment will be mainly described.

3.1 Timing Chart

Details of a read operation in the semiconductor storage device according to the third embodiment will be described.

Figure 22:
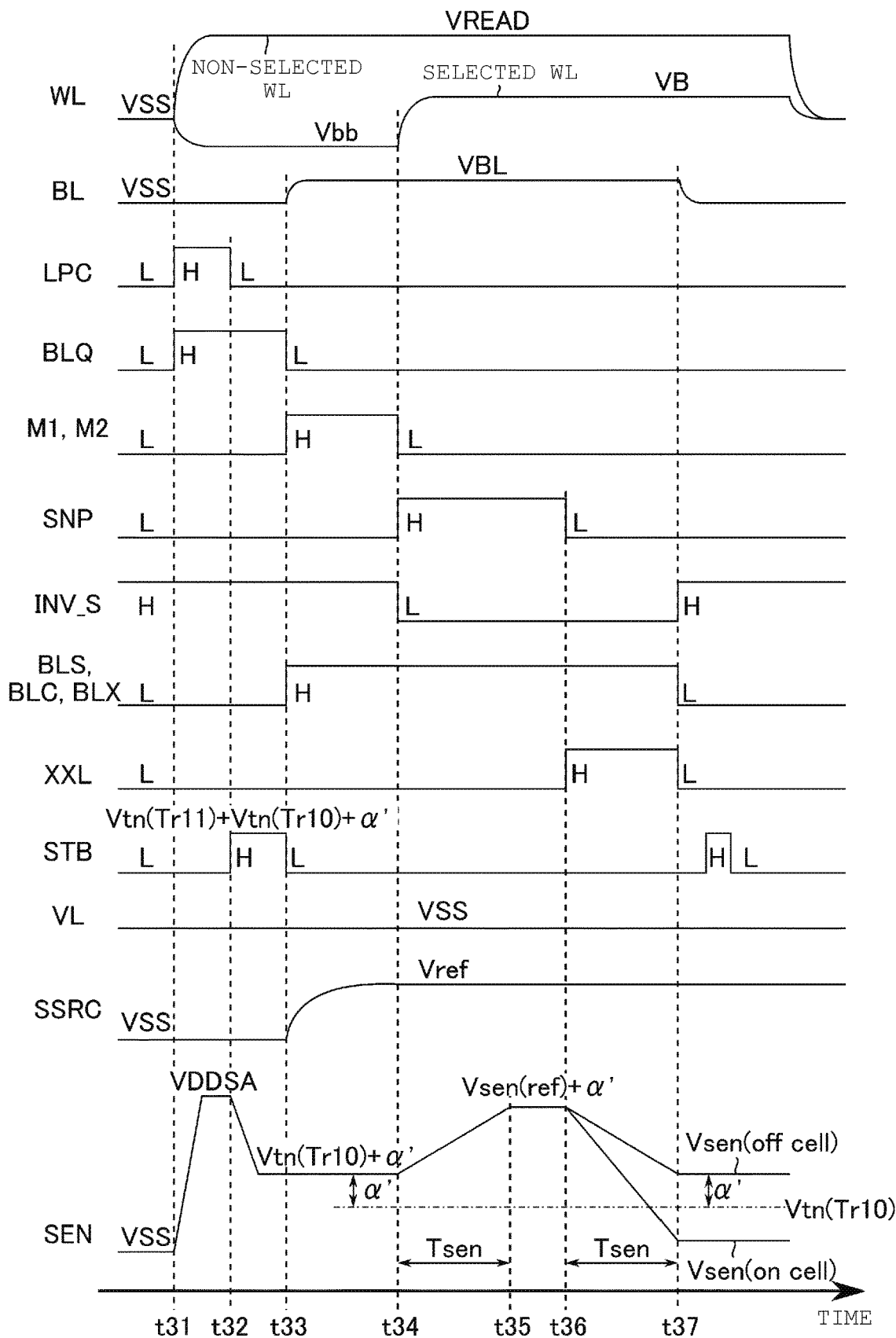
FIG. 22 is a timing chart illustrating an example of a lower page read operation in a semiconductor storage device according to a third embodiment.
Figure 23:
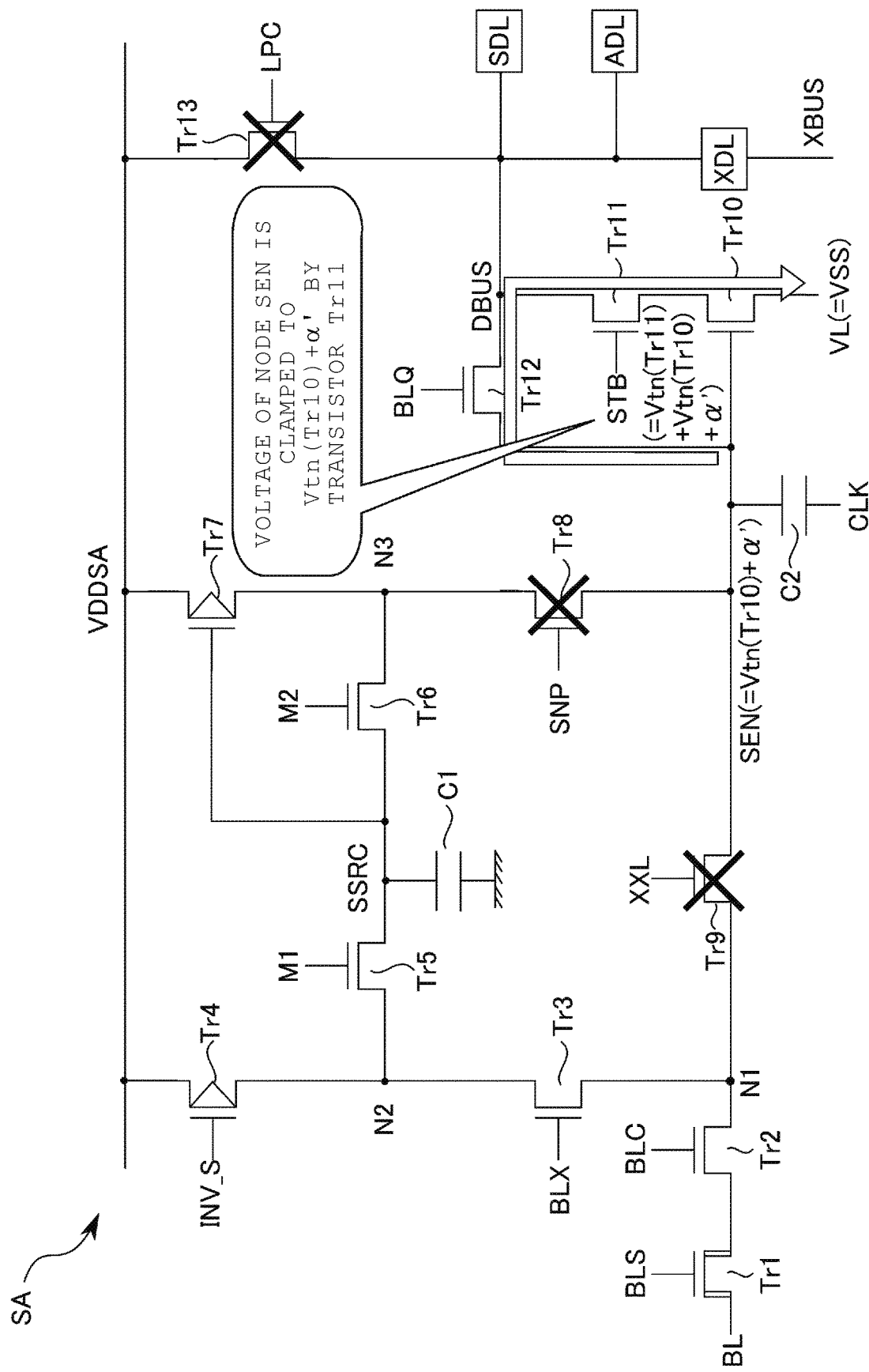
FIG. 23 is a schematic diagram illustrating an initial setting process of a sense node during a read operation in the semiconductor storage device according to the third embodiment.

Hereinafter, a case of lower page reading through an operation BR will be described using a timing chart illustrated in FIG. 22 and a schematic diagram illustrated in FIG. 23. FIGS. 22 and 23 respectively correspond to FIGS. 20 and 21 described in the second embodiment.

As illustrated in FIG. 22, before time t31, for example, all of transistors Tr1 to Tr6 and Tr8 to Tr13 in a sense amplifier SA except for a transistor Tr7 are set to be in an off state. In addition, a node VL is grounded to a voltage VSS after time t1.

At time t31, a read operation is started. The sequencer 170 sets signals BLQ and LPC to be in an "H" level to set the transistors Tr12 and Tr13 to be in an on state. Thereby, the node SEN is charged up to a voltage VDDSA, and the voltage VDDSA is held in the node SEN by the capacitor C2.

In addition, the sequencer 170 controls a row decoder 120 or the like to supply a voltage Vbb to a selected word line WLa3 and supplies a voltage VREAD to non-selected word lines WL0a to WL2a, WL4a to WL7a, and WLb0 to WLb7. Meanwhile, supply of a voltage to various word lines WL by the row decoder 120 may be completed by time t33 to be described later and may not be necessarily started at time t31.

At time t32, the sequencer 170 sets a signal STB to be in an "H" level to set the transistor Tr11 to be in an on state while setting a signal LPC to be in an "L" level to set the transistor Tr13 to be in an off state. Here, the sequencer 170 sets the signal STB being in an "H" level to have a voltage (Vtn (Tr11)+Vtn (Tr10)+α'). The voltage Vtn (Tr11) is a threshold voltage of the transistor Tr11. Thereby, as illustrated in FIG. 23, a voltage of the node SEN is set to be a voltage (Vtn (Tr10)+α') which is higher than the threshold voltage Vtn (Tr10) of the transistor Tr10 by a margin α'.

Operations after time t33 are the same as the operations after time t23 in FIG. 20 which are described in the second embodiment, and thus description thereof will be omitted.

After the above-described operations, the operation of reading lower page data from a selected memory cell transistor MCa3 using a read voltage VB is terminated.

3.2 Effects According to the Present Embodiment

According to the third embodiment, the sequencer 170 sets a voltage of the signal STB to be a voltage (Vtn (Tr11)+Vtn (Tr10)+a') when initial setting of the node SEN is performed. Thereby, it is possible to set the voltage of the node SEN to be a voltage (Vtn (Tr10)+α') by discharging the node SEN through the transistors Tr11 and Tr10. Thereby, it is possible to exhibit the same effects as those in the second embodiment.

In addition, the sequencer 170 does not change the voltage of the node VL from the voltage VSS in a read operation. For this reason, it is possible to reduce the possibility that the voltage of the node SEN will fluctuate due to a change in the voltage of the node VL.

4. Fourth Embodiment

Next, a semiconductor storage device according to a fourth embodiment will be described. In the first embodiment to the third embodiment, a case where an operation of charging the node SEN using a reference current Iref and an operation of discharging the node SEN using a read current Isen are executed at different timings is described. In the fourth embodiment, a case where an operation of charging a node SEN using a reference current Iref and an operation of discharging the node SEN using a read current Isen are executed at an overlapping timing will be described.

Meanwhile, in the following description, the same configurations and operations as those in the first embodiment will not be described, and configurations and operations different from those in the first embodiment will be mainly described.

4.1 Flowchart

Figure 24:
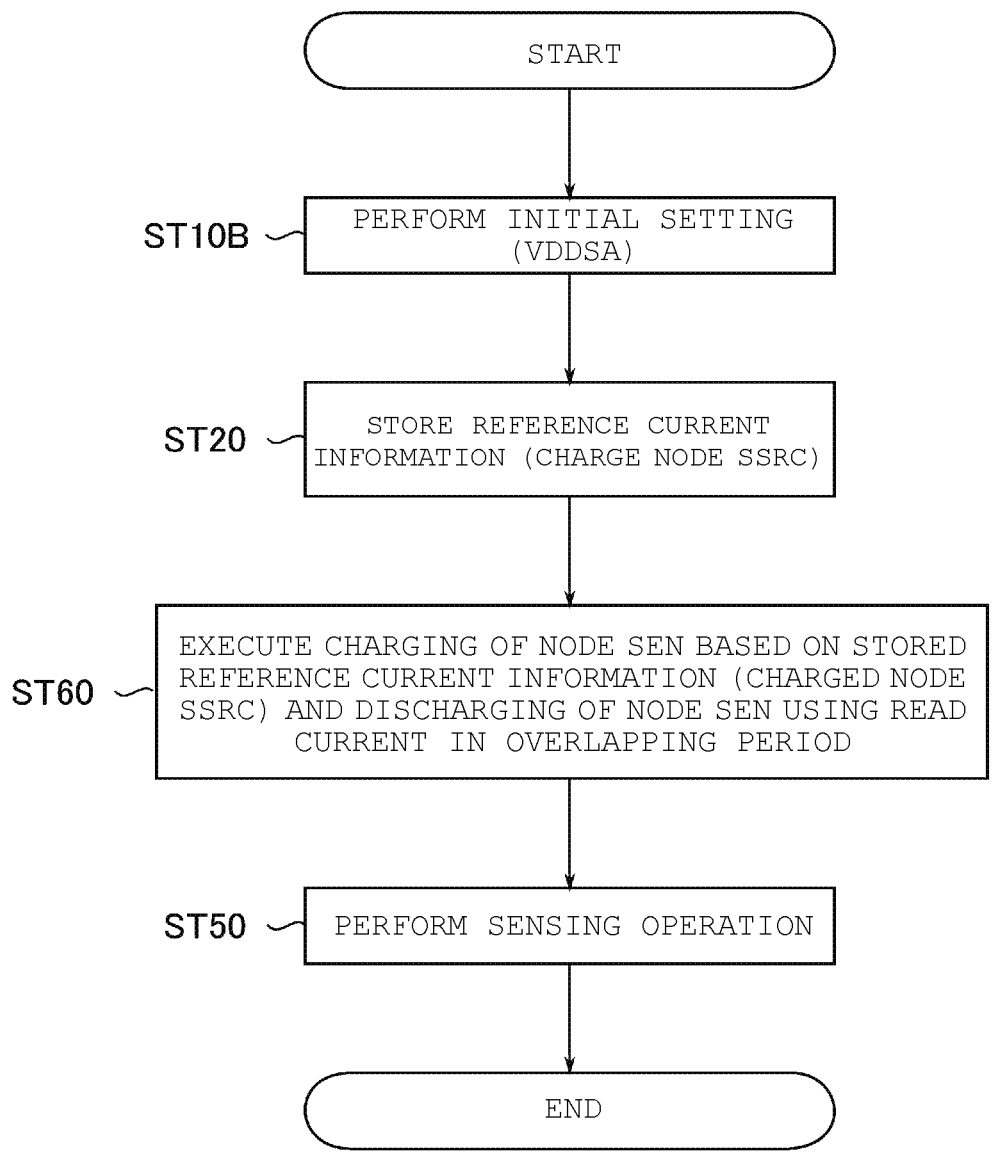
FIG. 24 is a flowchart illustrating a read operation in a semiconductor storage device according to a fourth embodiment.

FIG. 24 is a flowchart illustrating an outline of a read operation in the semiconductor storage device according to the fourth embodiment. Steps ST10B, ST20, and ST50 illustrated in FIG. 24 correspond to the steps ST10, ST20, and ST50 illustrated in FIG. 9, and step ST60 illustrated in FIG. 24 corresponds to steps ST30 and ST40 illustrated in FIG. 9.

As illustrated in FIG. 24, in step ST10B, a sense amplifier SA performs initial setting of a node SEN when a read operation is started. Specifically, the sense amplifier SA performs setting so that a voltage of the node SEN is set to be a voltage VDDSA.

In step ST20, the sense amplifier SA stores information corresponding to a reference current to the inside of the sense amplifier SA while applying the reference current to a selected memory string MS. Specifically, the sense amplifier SA charges a node SSRC on the basis of the reference current and holds a voltage of the node SSRC in a state where the reference current stably flows to the selected memory string MS.

In step ST60, the sense amplifier SA applies a read current to the selected memory string MS to discharge the node SEN while charging the node SEN by generating a current corresponding to the reference current on the basis of the information stored inside the sense amplifier SA, that is, on the basis of the voltage of the node SSRC charged in step ST20. That is, in step ST60, the sense amplifier SA executes a charging operation based on the reference current of the node SEN and a discharging operation based on the read current in an overlapping period.

In step ST50, the sense amplifier SA senses a threshold voltage of a selected memory cell transistor MC on the basis of the voltage of the node SEN and stores a result of the sensing in a latch circuit SDL or the like.

Thereafter, an operation of reading data from the selected memory cell transistor MC using the reference current and the read current flowing to the selected memory string MS described above is terminated.

4.2 Timing Chart

Next, details of a read operation in the semiconductor storage device according to the fourth embodiment will be described.

Figure 25:
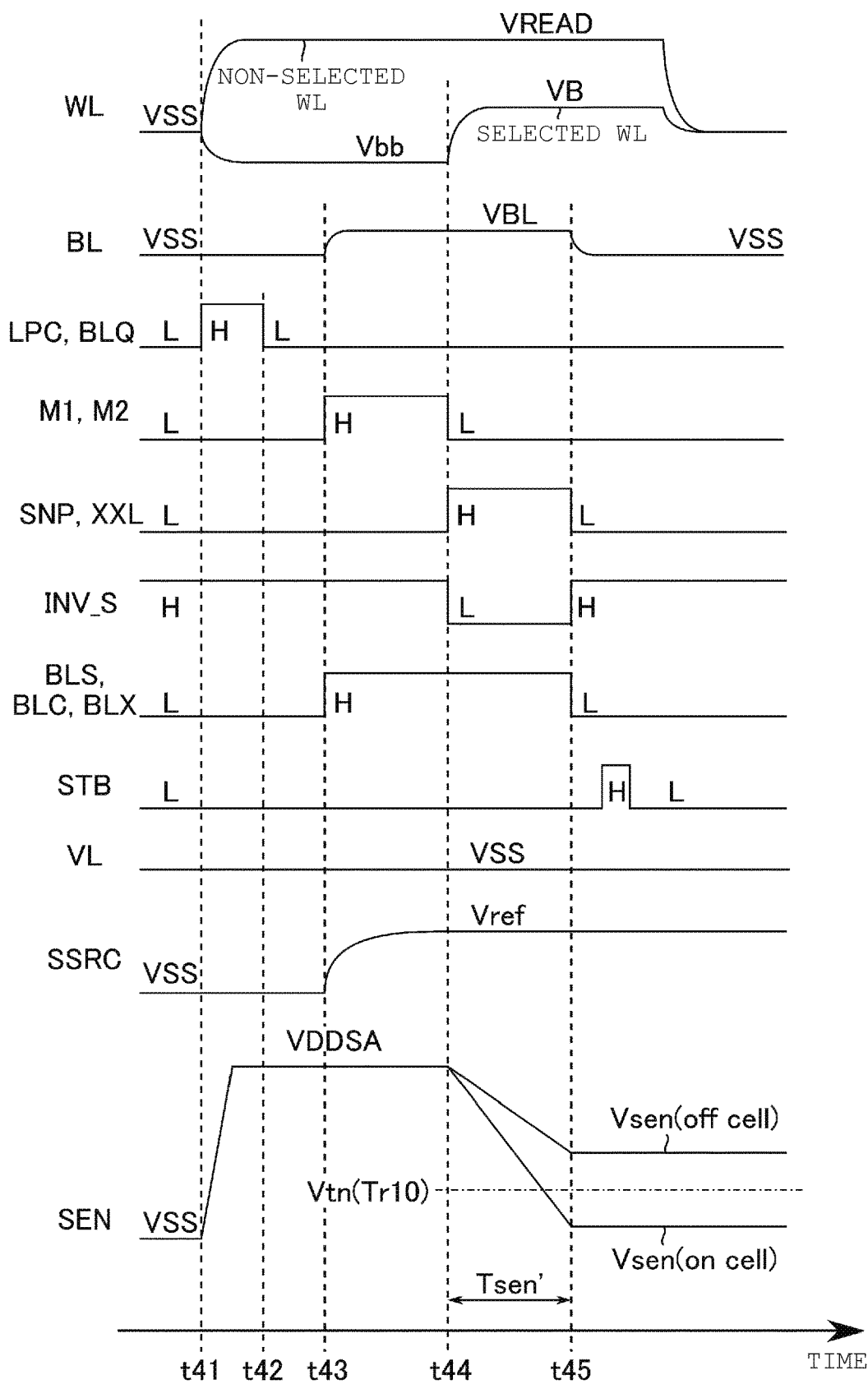
FIG. 25 is a timing chart illustrating an example of a lower page read operation in the semiconductor storage device according to the fourth embodiment.
Figure 26:
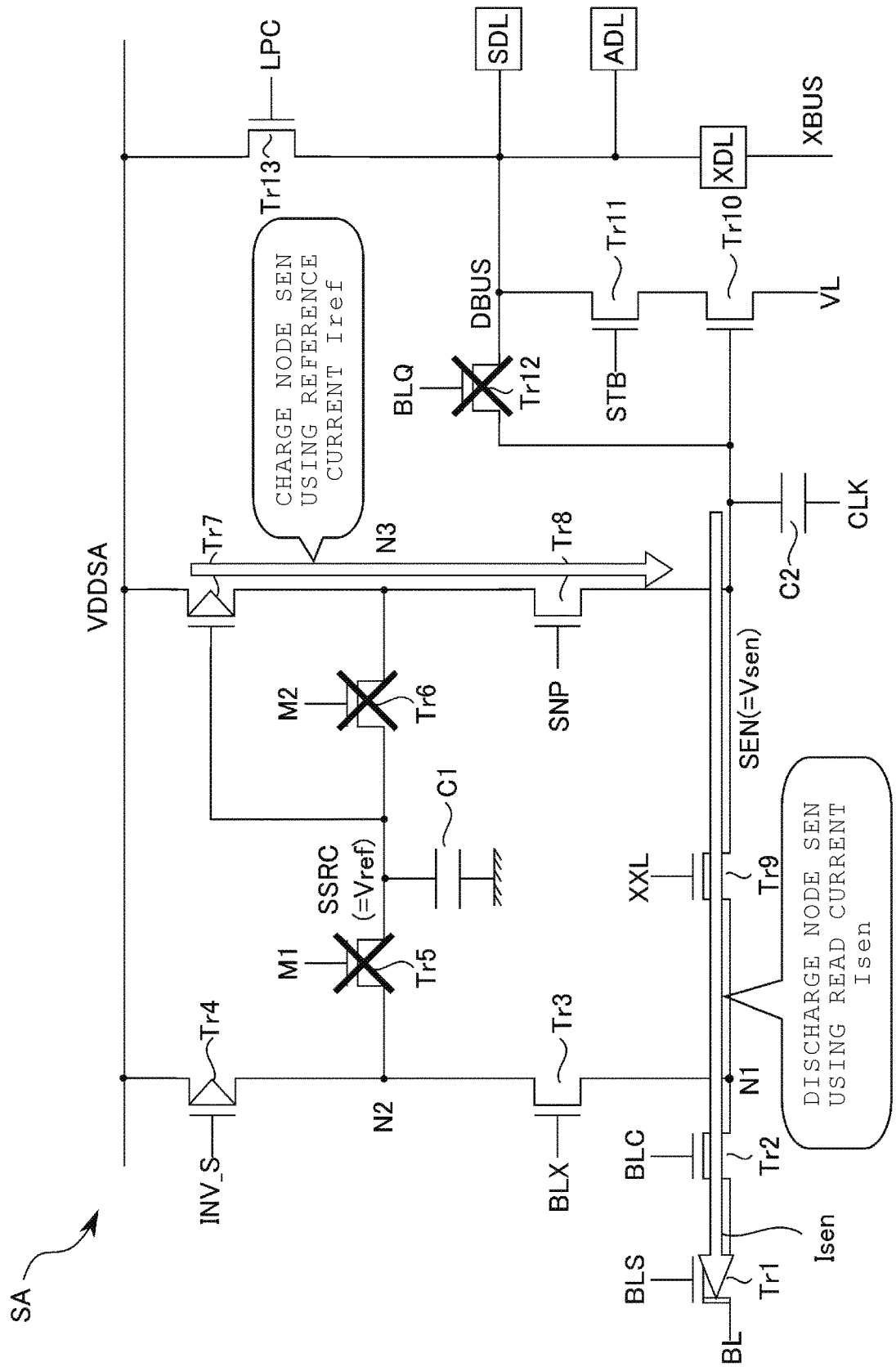
FIG. 26 is a schematic diagram illustrating a charging operation and a discharging operation of a sense node using a reference current and a read current during a read operation in the semiconductor storage device according to the fourth embodiment.

Hereinafter, a case of lower page reading through an operation BR will be described using a timing chart illustrated in FIG. 25 and a schematic diagram illustrated in FIG. 26. FIG. 25 and FIG. 26 respectively correspond to FIG. 10 and FIGS. 14 and 15 described in the first embodiment.

As illustrated in FIG. 25, before time t41, for example, all of transistors Tr1 to Tr6 and Tr8 to Tr13 in the sense amplifier SA except for a transistor Tr7 are set to be in an off state. In addition, a node VL is grounded to a voltage VSS after time t1.

At time t41, a read operation is started. A sequencer 170 sets signals BLQ and LPC to be in an "H" level to set transistors Tr12 and Tr13 to be in an on state. Thereby, a node SEN is charged up to a voltage VDDSA.

In addition, the sequencer 170 controls a row decoder 120 or the like to supply a voltage Vbb to a selected word line WLa3 and supplies a voltage VREAD to non-selected word lines WL0a to WL2a, WL4a to WL7a, and WLb0 to WLb7. Meanwhile, supply of a voltage to various word lines WL by the row decoder 120 may be completed by time t43 to be described later and may not be necessarily started at time t41.

At time t42, the sequencer 170 sets signals BLQ and LPC to be in an "L" level to set the transistors Tr12 and Tr13 to be in an off state. Thereby, the voltage VDDSA is held in the node SEN by a capacitor C2.

At time t43, the sequencer 170 sets signals BLS, BLC, BLX, M1, and M2 to be in an "H" level to set the transistors Tr1 to Tr3, Tr5, and Tr6 to be in an on state. Thereby, a reference current Iref flows to a bit line BL through a current path including the transistors Tr7, Tr6, Tr5, and Tr3 to Tr1. Thereby, a voltage of a node SSRC in the sense amplifier SA is charged up to a voltage Vref.

At time t44, the sequencer 170 sets signals M1 and M2 to be in an "L" level to set the transistors Tr5 and Tr6 to be in an off state. Thereby, the voltage Vref is held in a node SSRC by a capacitor C1, and a state where the voltage Vref is applied to the gate (that is, a state where the reference current Iref is applied) is held in the transistor Tr7. In addition, the sequencer 170 controls the row decoder 120 or the like to supply a voltage VB to a selected word line WLa3, and the sequencer sets a signal INV_S to be in an "L" level and sets signals SNP and XXL to be in an "H" level to set the transistors Tr4, Tr8, and Tr9 to be in an on state. Thereby, the node SEN is charged by the reference current Iref flowing through the transistors Tr7 and Tr8 and is discharged by a read current Isen flowing through the transistors Tr9, Tr2, and Tr1. Meanwhile, since the voltage of the node SSRC is fixed to Vref and the voltage of the bit line BL is clamped to the voltage VBL, the sum of the reference current Iref and the read current Isen flowing to the node SEN after time t44 has a fixed value. For this reason, the voltage of the node SEN is charged and discharged at a fixed rate during a period in which the transistors Tr8 and Tr9 are set to be in an on state.

After a period Tsen' elapses from time t44, that is, at time t45, the sequencer 170 sets the signals BLS, BLC, BLX, SNP, and XXL to be in an "L" level to set the transistors Tr1 to Tr3, Tr8, and Tr9 to be in an off state while setting the signal INV_S to be in an "H" level to set the transistor Tr4 to be in an off state. Thereby, as in the following Expression (10), the node SEN is discharged up to a voltage Vsen by the reference current Iref and the read current Isen over the period Tsen', and the voltage Vsen is held in the node SEN by the capacitor C2.

[Expression 8]

$$Vsen = VDDSA - (Isen - Iref) \times Tsen'/C2 = \\ VDDSA - (Icell(Vcgrv) - Icell(Vbb)) \times Tsen'/C2 \qquad (10)$$

Thereafter, the sequencer 170 stores data based on the operation BR in the latch circuit SDL by setting the signal STB to be in an "H" level to set the transistor Tr11 to be in an on state.

After the above-described operations, the operation of reading lower page data from a selected memory cell transistor MCa3 using a read voltage VB is terminated.

4.3 Effects According to the Present Embodiment

According to the fourth embodiment, the sequencer 170 executes a charging operation using the reference current Iref and a discharging operation using the read current Isen in an overlapping period Tsen' with respect to the node SEN for which initial setting to a voltage VDDSA is performed. Thereby, it is possible to shorten a period until the node SEN is set to a voltage Vsen. For this reason, it is possible to shorten time required for a read operation.

In addition, both a period required for a charging operation using the reference current Iref and a period required for a discharging operation using the read current Isen are set to be a period Tsen', and thus it is possible to cancel a term related to a current Ibg from the voltage Vsen of the node SEN. For this reason, similar to the second embodiment and the third embodiment, it is possible to set the voltage Vsen so as not to include parameters depending on the current Ibg. Therefore, it is possible to prevent erroneous reading of data.

5. Modification Example

Meanwhile, various modifications may be made to the above-described first to fourth embodiments.

For example, in the above-described first to fourth embodiments, a case where a voltage VREAD is applied to a non-selected word line WL when a reference current Iref and a read current Isen are applied to the memory pillar MP including a selected memory cell transistor MC is described, but these are not limiting examples. For example, a voltage different from the voltage VREAD may be applied to some of non-selected word lines WL in accordance with a positional relationship with a selected word line WL.

Figure 27:
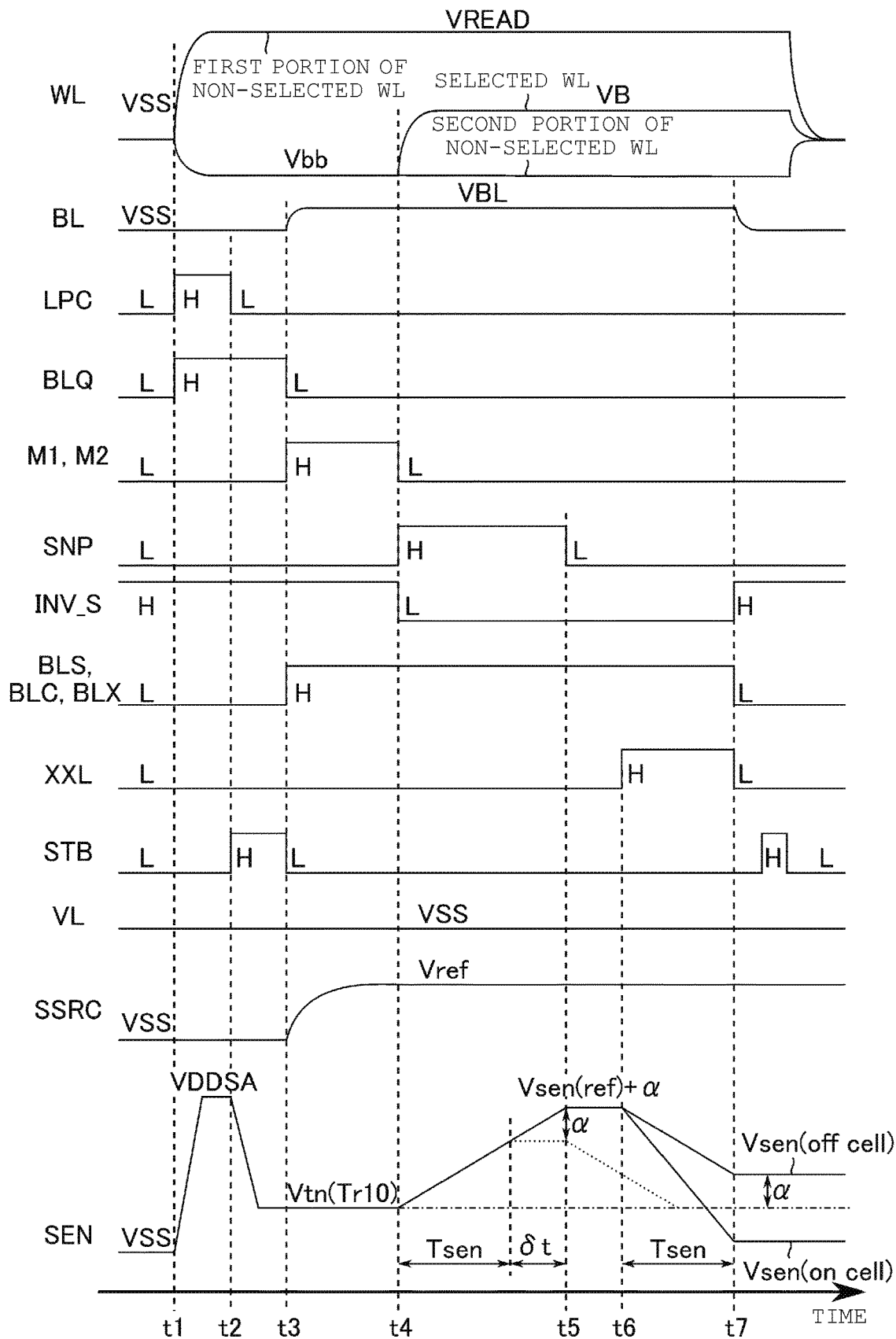
FIG. 27 is a timing chart illustrating an example of a lower page read operation in a semiconductor storage device according to a first modification example to a fourth modification example.

FIG. 27 is a timing chart illustrating a lower page read operation in semiconductor storage devices according to various modification examples. FIG. 27 corresponds to FIG. 10 described in the first embodiment.

As illustrated in FIG. 27, operations in sense amplifiers SA in various modification examples to be described below are the same as those in the case of FIG. 10, and thus description thereof will be omitted. On the other hand, in various modification examples to be described below, voltages applied to word lines WL are different from those in the case of FIG. 10. For example, a sequencer 170 may be configured to apply a voltage VREAD to a first portion of a non-selected word line WL and apply a voltage Vbb to a second portion thereof.

Hereinafter, some modification examples according to variations in a first portion and a second portion of a non-selected word line WL illustrated in FIG. 27 will be described.

5.1 First Modification Example

Figure 28:
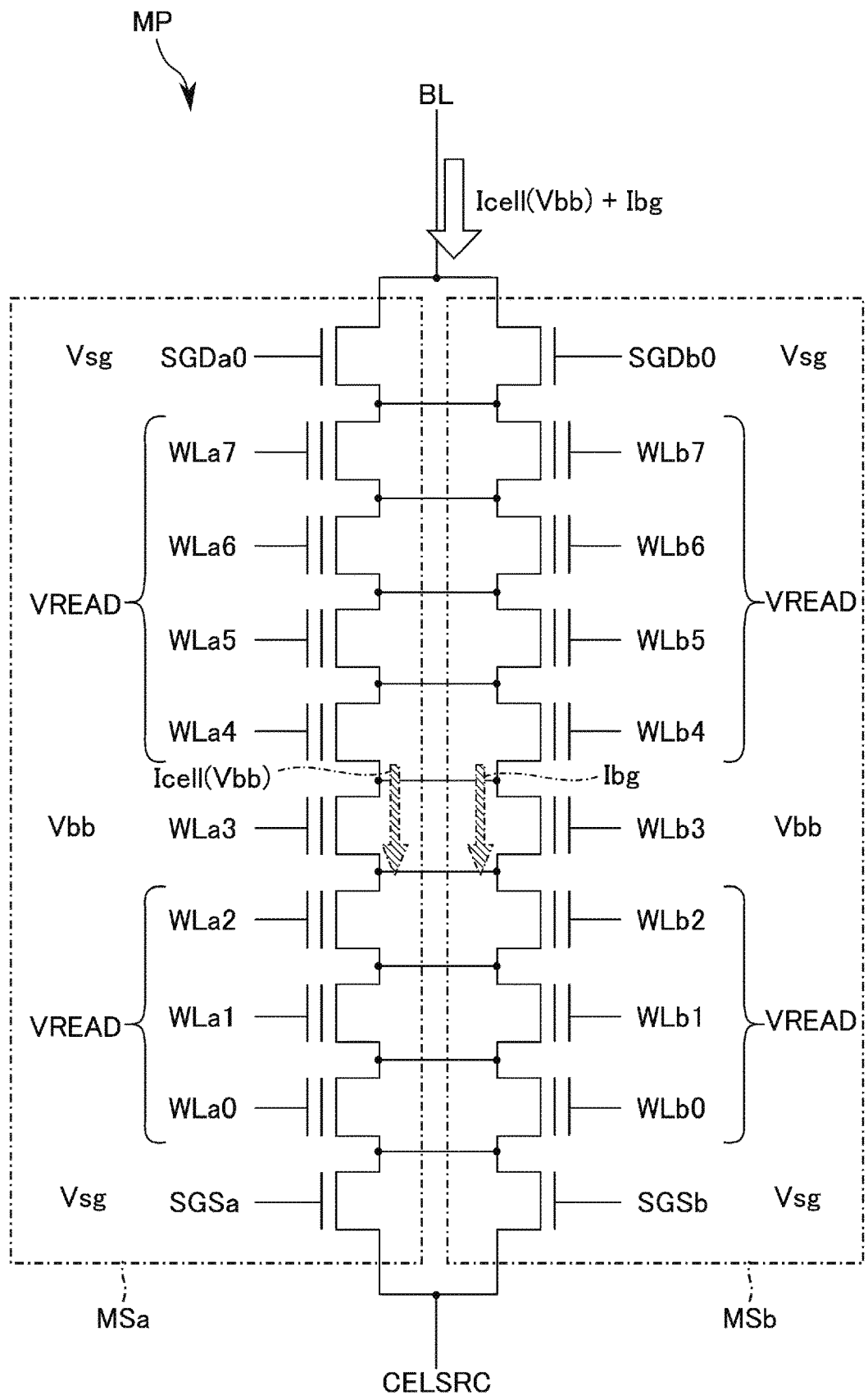
FIG. 28 is a schematic diagram illustrating a reference current flowing through a memory pillar at the time of a read operation in the semiconductor storage device according to the first modification example.

First, a semiconductor storage device according to a first modification example will be described using FIG. 28. FIG. 28 is a schematic diagram illustrating voltages applied to various word lines WL when a reference current Iref flows into a memory pillar MP including a selected memory string MS in the semiconductor storage device according to the first modification example.

As illustrated in FIG. 28, when a reference current Iref is applied, a voltage Vbb may also be applied to a non-selected word line WLb3 corresponding to a non-selected memory cell transistor MCb3 which is a current path parallel to a selected memory cell transistor MCa3, in addition to a selected word line WLa3. In addition, a voltage VREAD may be applied to the other non-selected word lines WLa0 to WLa2, WLa4 to WLa7, WLb0 to WLb2, and WLb4 to WLb7. Meanwhile, as described above, a voltage applied to a non-selected word line WL is not changed when the reference current Iref is applied into the memory pillar MP and when a read current Isen is applied thereinto. For this reason, in the first modification example, when the read current Isen is applied, a read voltage Vcgrv is applied to the selected word line WLa3. On the other hand, the voltage Vbb is applied to the non-selected word line WLb3, and the voltage VREAD is applied to non-selected word lines WLa0 to WLa2, WLa4 to WLa7, WLb0 to WLb2, and WLb4 to WLb7 (not shown).

In this case, thereby, it is easy to design the sense amplifier SA, and thus it is possible to reduce a design load.

In addition, non-selected memory cell transistors MCa0 to MCa2, MCa4 to MCa7, MCb0 to MCb2, and MCb4 to MCb7 are set to be in an on state. For this reason, it is possible to increase a cross-section of a current path (channel) in the memory pillar MP on both a source side and a drain side of the selected memory cell transistor MCa3 and to make it easy for a read current Isen (on cell) in the case of on cell to flow more. Therefore, it is possible to improve sensitivity of a difference in a voltage Vsen of a node SEN in the case of on cell and the case of off cell and to prevent erroneous reading of data.

5.2 Second Modification Example

Figure 29:
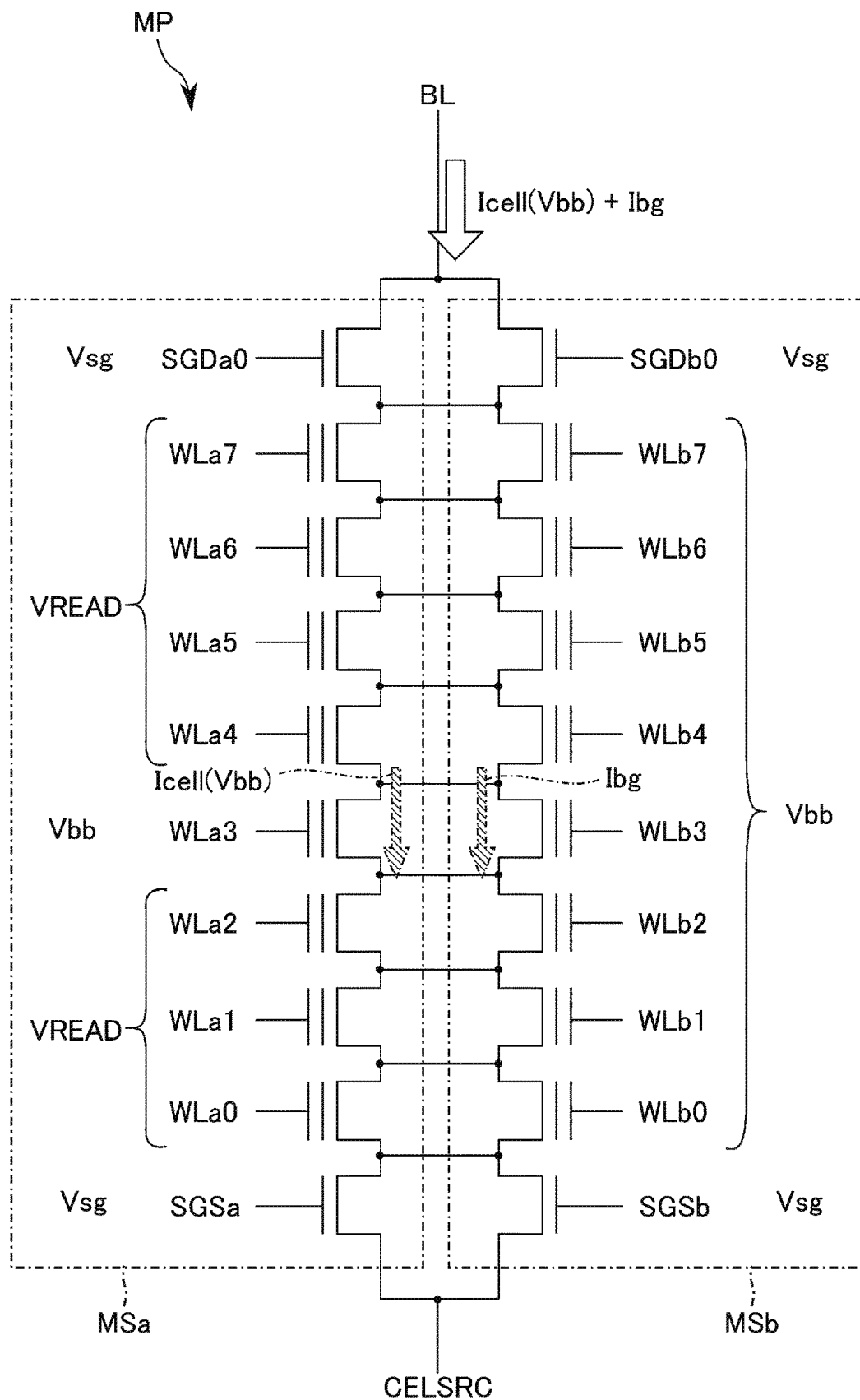
FIG. 29 is a schematic diagram illustrating a reference current flowing through a memory pillar at the time of a read operation in the semiconductor storage device according to the second modification example.

Next, a semiconductor storage device according to a second modification example will be described using FIG. 29. FIG. 29 is a schematic diagram illustrating voltages to be applied to various word lines WL when a reference current Iref flows into a memory pillar MP including a selected memory string MS in the semiconductor storage device according to the second modification example.

As illustrated in FIG. 29, when the reference current Iref is applied, a voltage Vbb may also be applied to non-selected word lines WLb0 to WLb7 corresponding to a non-selected memory string MSb, in addition to a selected word line WLa3. In addition, a voltage VREAD may be applied to the other non-selected word lines WLa0 to WLa2 and WLa4 to WLa7. Meanwhile, as described above, a voltage applied to a non-selected word line WL is not changed when the reference current Iref is applied into the memory pillar MP and when a read current Isen is applied thereinto. For this reason, in the second modification example, when the read current Isen is applied, a read voltage Vcgrv is applied to the selected word line WLa3. On the other hand, the voltage Vbb is applied to the non-selected word lines WLb0 to WLb7, and the voltage VREAD is applied to the non-selected word lines WLa0 to WLa2 and WLa4 to WLa7 (not shown).

In this case, since all memory cell transistors MC in the non-selected memory string MSb are set to be in an off state, it is possible to drastically reduce a current Ibg. For this reason, it is possible to drastically reduce the influence of noise given to the node SEN by the current Ibg. In addition, it is possible to drastically reduce an absolute value of the reference current Iref and to drastically reduce a voltage with which the node SEN is charged.

5.3 Third Modification Example

Figure 30:
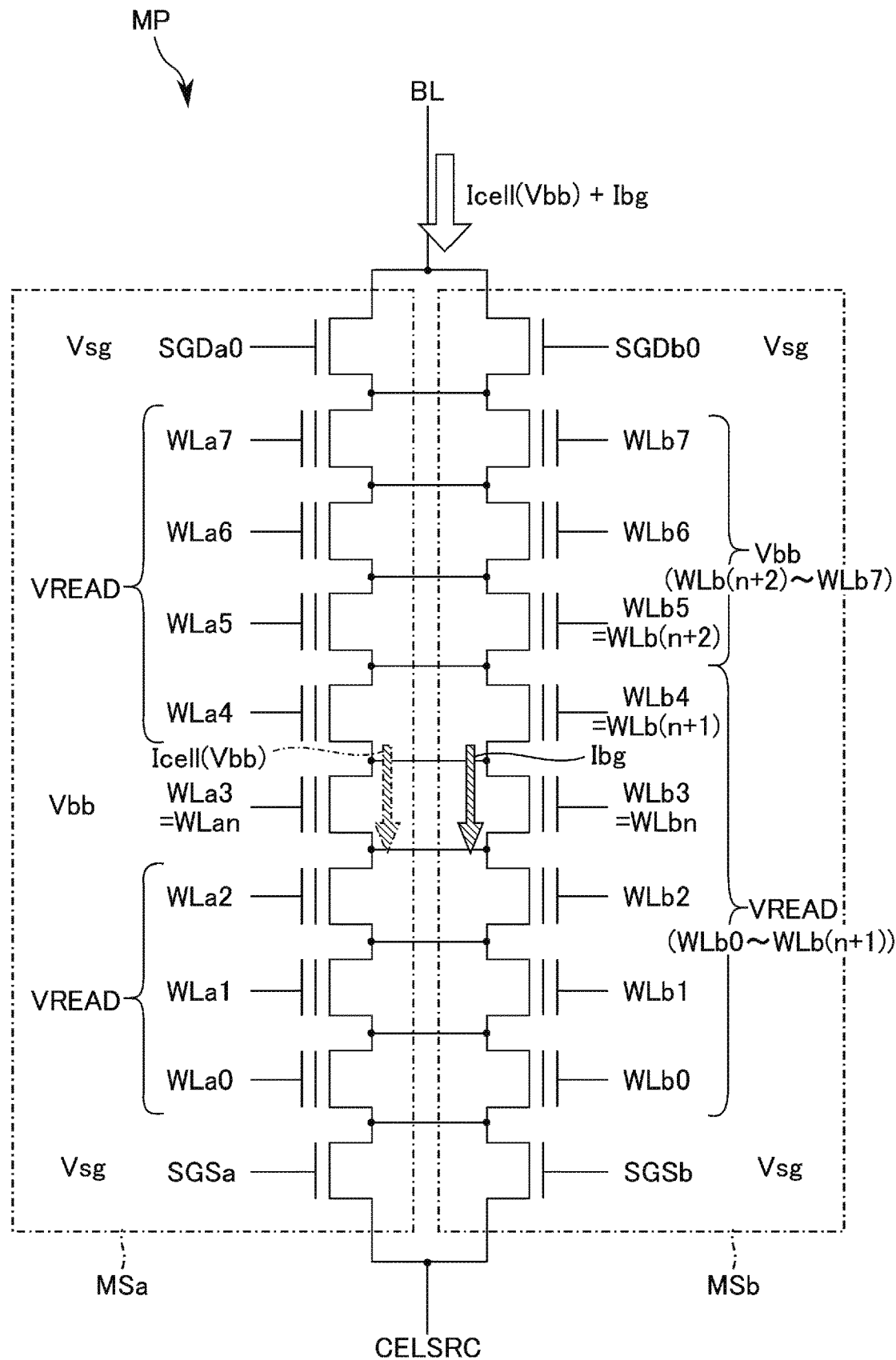
FIG. 30 is a schematic diagram illustrating a reference current flowing through a memory pillar at the time of a read operation in the semiconductor storage device according to the third modification example.

Next, a semiconductor storage device according to a third modification example will be described using FIG. 30. FIG. 30 is a schematic diagram illustrating voltages applied to various word lines WL when a reference current Iref flows into a memory pillar MP including a selected memory string MS in the semiconductor storage device according to the third modification example. Meanwhile, hereinafter, for convenience of description, a selected memory cell transistor MC is denoted by MCan ($0 \leq n \leq 7$), and a case of n=3 is illustrated in FIG. 30.

As illustrated in FIG. 30, when a reference current Iref is applied, a voltage Vbb may also be applied to non-selected word lines WLb (n+2) to WLb7 among word lines WLb corresponding to a non-selected memory string MSb, in addition to a selected word line WLan. In addition, a voltage VREAD may be applied to the other non-selected word lines WLa0 to WLa (n−1), WLa (n+1) to WLa7, and WLb0 to WLb (n+1). Meanwhile, as described above, a voltage applied to a non-selected word line WL is not changed when the reference current Iref is applied into the memory pillar MP and when a read current Isen is applied thereinto. For this reason, in the third modification example, when the read current Isen is applied, a read voltage Vcgrv is applied to the selected word line WLan. On the other hand, the voltage Vbb is applied to the non-selected word lines WLb (n+2) to WLb7, and the voltage VREAD is applied to the non-selected word lines WLa0 to WLa (n−1), WLa (n+1) to WLa7, and WLb0 to WLb (n+1) (not shown).

Meanwhile, in a case of n=6 or 7, a voltage may be applied to a dummy word line not shown in the drawing and formed between a word line WL7 and a select gate line SGD according to the above-described regularity.

In this case, since a non-selected memory cell transistor MCbn is set to be in an on state, a current path is formed between a charge storage layer 33b of the non-selected memory cell transistor MCbn and a selected memory cell transistor MCan. For this reason, it is possible to reduce the influence of the magnitude of a threshold voltage of the non-selected memory cell transistor MCbn on a current Icell (Vcgrv).

In addition, non-selected memory cell transistors MCa0 to MCa (n−1) and MCb0 to MCb (n−1) are set to be in an on state. For this reason, it is possible to increase a cross-section of a current path (channel) in the memory pillar MP on a source side of the selected memory cell transistor MCan and to make a read current Isen (on cell) in the case of on cell to flow easily. Therefore, it is possible to improve sensitivity of a difference in a voltage Vsen of a node SEN in the case of on cell and the case of off cell and to prevent erroneous reading of data.

5.4 Fourth Modification Example

Figure 31:
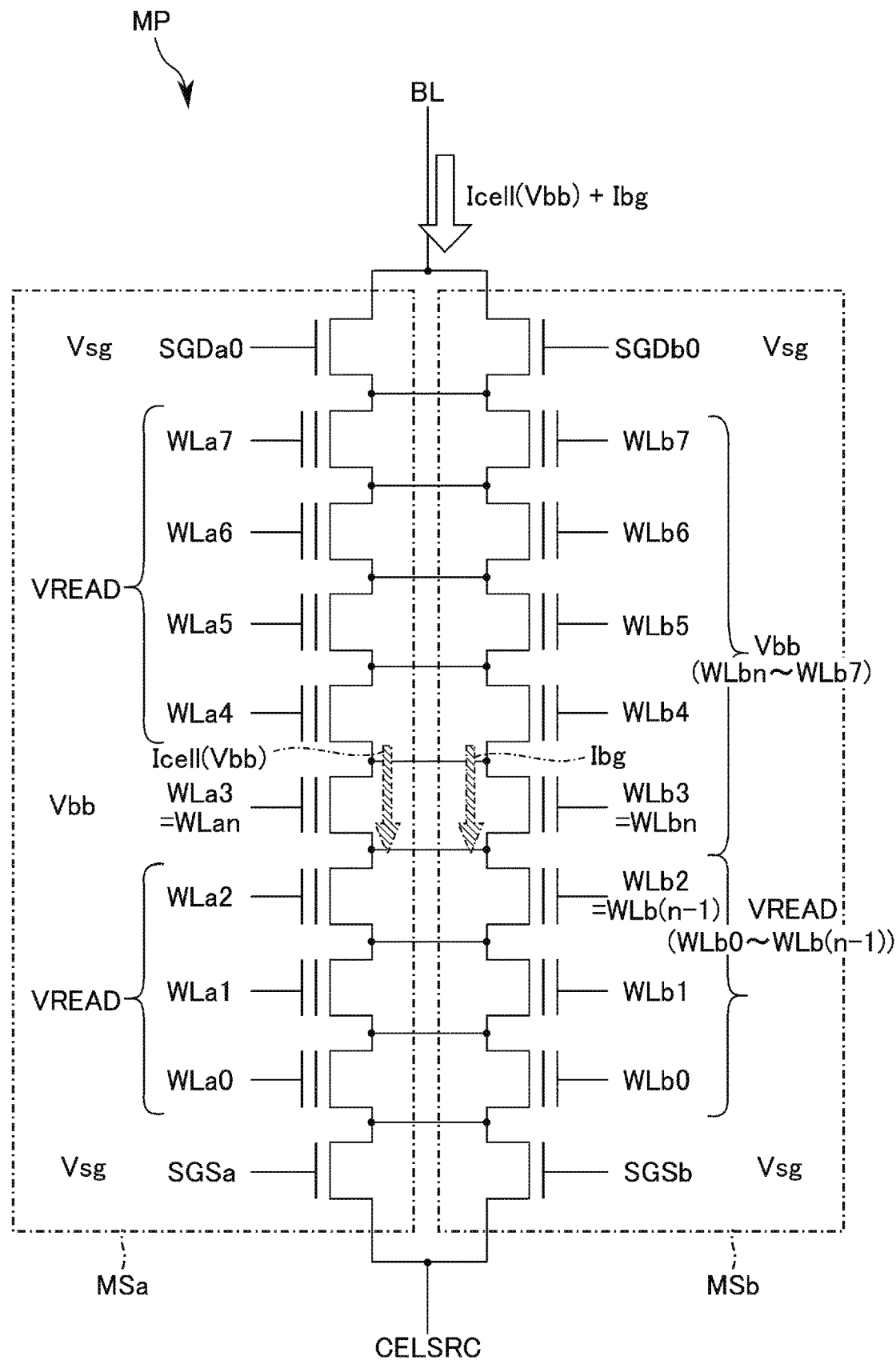
FIG. 31 is a schematic diagram illustrating a reference current flowing through a memory pillar at the time of a read operation in the semiconductor storage device according to the fourth modification example.

Next, a semiconductor storage device according to a fourth modification example will be described using FIG. 31. FIG. 31 is a schematic diagram illustrating voltages to be applied to various word lines WL when a reference current Iref flows into a memory pillar MP including a selected memory string MS in the semiconductor storage device according to the fourth modification example. Meanwhile, hereinafter, for convenience of description, similar to the third modification example, a selected memory cell transistor MC is denoted by MCan (0≤n≤5), and a case of n=3 is illustrated in FIG. 31.

As illustrated in FIG. 31, when a reference current Iref is applied, a voltage Vbb may also be applied to non-selected word lines WLbn to WLb7 among word lines WLb corresponding to a non-selected memory string MSb, in addition to a selected word line WLan. In addition, a voltage VREAD may be applied to the other non-selected word lines WLa0 to WLa (n−1), WLa (n+1) to WLa7, and WLb0 to WLb (n−1). Meanwhile, as described above, a voltage applied to a non-selected word line WL is not changed when the reference current Iref is applied into the memory pillar MP and when a read current Isen is applied thereinto. For this reason, in the fourth modification example, when the read current Isen is applied, a read voltage Vcgrv is applied to the selected word line WLan. On the other hand, the voltage Vbb is applied to the non-selected word lines WLbn to WLb7, and the voltage VREAD is applied to the non-selected word lines WLa0 to WLa (n−1), WLa (n+1) to WLa7, and WLb0 to WLb (n−1) (not shown).

Meanwhile, in a case of n=0, a voltage according to the above-described regularity may be applied to a dummy word line not shown in the drawing and formed between a word line WL0 and a select gate line SGS.

In this case, since a non-selected memory cell transistor MCb3 is set to be in an off state, a current Ibg can be reduced. For this reason, it is possible to reduce the influence of noise given to the node SEN by the current Ibg. In addition, since an absolute value of the reference current Iref is reduced due to a reduction in the current Ibg, it is possible to reduce a voltage with which the node SEN is charged by the reference current Iref.

In addition, non-selected memory cell transistors MCa0 to MCa (n−1) and MCb0 to MCb (n−1) are set to be in an on state. For this reason, it is possible to increase a cross-section of a current path (channel) in the memory pillar MP on a source side of the selected memory cell transistor MCan and to make a read current Isen (on cell) in the case of on cell to flow easily. Therefore, it is possible to improve sensitivity of a difference in a voltage Vsen of the node SEN in the case of on cell and the case of off cell and to prevent erroneous reading of data.

6. Others

Further, in the above-described first to fourth embodiments, a case where the charge storage layer 33 contains polysilicon or a metal material is described, but these are not limiting examples. For example, the charge storage layer 33 may contain an insulating material such as silicon nitride (SiN). In this case, the charge storage layers 33a and 33b function as charge trap type charge storage layers, and thus the charge storage layers are not necessarily required to be separated from each other and may be formed integrally.

Further, in the first to fourth embodiments, a case where two memory strings MSa and MSb are formed in one memory pillar MP is described, but these are not limiting examples. For example, a read operation based on the above-described reference current Iref and read current Isen may be applied even in a case where one memory string MS is formed in one memory pillar MP and a case where three or more memory strings MS are formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first memory cell and a second memory cell which are connected to each other in series;
   a first word line which is connected to the first memory cell;
   a second word line which is connected to the second memory cell; and
   a control circuit,
   wherein the control circuit is configured to charge a first node while applying a second voltage to the second word line and a first voltage to the first word line, to charge a second node on the basis of a voltage of the charged first node, to discharge the second node while applying the second voltage to the second word line and a third voltage to the first word line, and to read data from the first memory cell on the basis of voltages of the charged and discharged second node.

2. The semiconductor storage device according to claim 1, wherein the third voltage is higher than the first voltage and lower than the second voltage.

3. The semiconductor storage device according to claim 2, wherein the first voltage is a negative voltage.

4. The semiconductor storage device according to claim 1, wherein the control circuit is configured to charge the second node and then discharge the second node.

5. The semiconductor storage device according to claim 4, wherein a first period in which the second node is charged is longer than a second period in which the second node is discharged.

6. The semiconductor storage device according to claim 4, wherein the first period in which the second node is charged is equal to the second period in which the second node is discharged.

7. The semiconductor storage device according to claim 1, wherein the control circuit is configured to perform charging of the second node on the basis of the voltage of the charged first node and discharging of the second node toward the first memory cell, while applying the second voltage to the second word line and the third voltage to the first word line.

8. The semiconductor storage device according to claim 1, wherein the control circuit includes
a first transistor which connects the first node to the first memory cell and the second memory cell,
a second transistor which includes a first end connected to the first node and a second end connected to a third node,
a third transistor which includes a first end connected to the third node, a second end connected to a voltage supply node, and a gate connected to the first node,
a fourth transistor which includes a first end connected to the second node and a second end connected to the third node, and
a fifth transistor which connects the second node to the first memory cell and the second memory cell.

9. The semiconductor storage device according to claim 8, wherein the third transistor has a polarity different from polarities of the first transistor, the second transistor, the fourth transistor, and the fifth transistor.

10. The semiconductor storage device according to claim 8, wherein the control circuit further includes
a first capacitor which is connected to the first node, and
a second capacitor which is connected to the second node.

11. The semiconductor storage device according to claim 8, wherein the control circuit is configured to charge the first node by setting the fourth transistor and the fifth transistor to be in an off state while setting the first transistor, the second transistor, and the third transistor to be in an on state, to charge the second node by setting the first transistor and the second transistor to be in an off state while setting the third transistor and the fourth transistor to be in an on state, and to discharge the second node by setting the first transistor and the second transistor to be in an off state while setting the fifth transistor to be in an on state.

12. The semiconductor storage device according to claim 8, wherein the control circuit further includes a sixth transistor including a first end connected to a fourth node and a gate connected to the second node and is configured to apply equal voltages to the fourth node before the second node is charged and after the second node is discharged.

13. The semiconductor storage device according to claim 8, wherein the control circuit further includes a sixth transistor including a first end connected to a fourth node and a gate connected to the second node and is configured to apply a fourth voltage to the fourth node before the second node is charged and to apply a fifth voltage lower than the fourth voltage to the fourth node after the second node is discharged.

14. The semiconductor storage device according to claim 1, further comprising:
a third memory cell which is connected to the first memory cell in parallel with respect to the second memory cell;
a fourth memory cell which is connected to the second memory cell in parallel with respect to the first memory cell and connected to the third memory cell in series;
a third word line which is connected to the third memory cell; and
a fourth word line which is connected to the fourth memory cell,
wherein the third memory cell and the fourth memory cell share a well region with the first memory cell and the second memory cell and are arranged so that the well region is interposed therebetween.

15. The semiconductor storage device according to claim 14, wherein the control circuit is configured to charge the first node while applying the second voltage to the second word line, the third word line, and the fourth word line and the first voltage to the first word line, and to discharge the second node while applying the second voltage to the second word line, the third word line, and the fourth word line and the third voltage to the first word line.

16. The semiconductor storage device according to claim 14, wherein the control circuit is configured to charge the first node while applying the second voltage to the second word line and the fourth word line and the first voltage to the first word line and the third word line, and to discharge the second node while applying the third voltage to the first word line, the second voltage to the second word line and the fourth word line, and the first voltage to the third word line.

17. The semiconductor storage device according to claim 14, wherein the control circuit is configured to charge the first node while applying the second voltage to the second word line and the first voltage to the first word line, the third word line, and the fourth word line, and to discharge the second node while applying the third voltage to the first word line, the second voltage to the second word line, and the first voltage to the third word line and the fourth word line.

18. The semiconductor storage device according to claim 14, wherein
the control circuit is configured to charge the first node while applying the second voltage to the second word line and the third word line and the first voltage to the first word line and the fourth word line, and to discharge the second node while applying the third voltage to the first word line, the second voltage to the second word line and the third word line, and the first voltage to the fourth word line, and
the fourth memory cell is provided between the third memory cell and a bit line.

19. The semiconductor storage device according to claim 14, wherein
the control circuit is configured to charge the first node while applying the second voltage to the second word line and applying the first voltage to the first word line, the third word line, and the fourth word line, and to discharge the second node while applying the third voltage to the first word line, the second voltage to the second word line, and the first voltage to the third word line and the fourth word line, and
the fourth memory cell is provided between the third memory cell and a bit line.

20. A method of performing a read operation in a semiconductor storage device that includes a first memory cell and a second memory cell which are connected to each other in series, a first word line which is connected to the first memory cell, and a second word line which is connected to the second memory cell, said method comprising:
charging a first node while applying a second voltage to the second word line and a first voltage to the first word line;

charging a second node on the basis of a voltage of the charged first node;

discharging the second node while applying the second voltage to the second word line and a third voltage to the first word line, wherein the third voltage is greater than the first voltage and less than the second voltage; and reading data from the first memory cell on the basis of voltages of the charged and discharged second node.

* * * * *